United States Patent
Yoshida

[11] Patent Number: 6,115,315
[45] Date of Patent: Sep. 5, 2000

[54] SEMICONDUCTOR MEMORY DEVICE ADAPTED FOR LARGE CAPACITY AND HIGH-SPEED ERASURE

[75] Inventor: Masanobu Yoshida, Kawasaki, Japan

[73] Assignee: Fujitsu Limited, Kanagawa, Japan

[21] Appl. No.: 09/064,842

[22] Filed: Apr. 23, 1998

[30] Foreign Application Priority Data

Apr. 25, 1997 [JP] Japan ..................................... 9-109792
Mar. 27, 1998 [JP] Japan ................................. 10-082302

[51] Int. Cl.[7] ...................................................... G11C 8/00
[52] U.S. Cl. ........................................ 365/230.03; 365/63
[58] Field of Search ........................ 365/230.03, 230.06, 365/63, 200

[56] References Cited

U.S. PATENT DOCUMENTS

| | | | |
|---|---|---|---|
| 5,629,898 | 5/1997 | Idei et al. | 365/230.03 |
| 5,663,905 | 9/1997 | Matsuo et al. | 365/230.03 |
| 5,808,948 | 9/1998 | Kim et al. | 365/230.03 |
| 5,848,006 | 12/1998 | Nagata | 365/230.06 |

FOREIGN PATENT DOCUMENTS 5-275657  10/1993  Japan .

*Primary Examiner*—Son T. Dinh
*Attorney, Agent, or Firm*—Arent Fox Kintner Plotkin & Kahn

[57] ABSTRACT

A semiconductor memory device includes a first memory cell consisting of a single-gate transistor and a stacked-gate transistor and a second memory cell consisting of a stacked-gate transistor, and is constructed such that a memory cell array composed of the first memory cells and a memory cell array composed of the second memory cells share peripheral circuits.

16 Claims, 21 Drawing Sheets

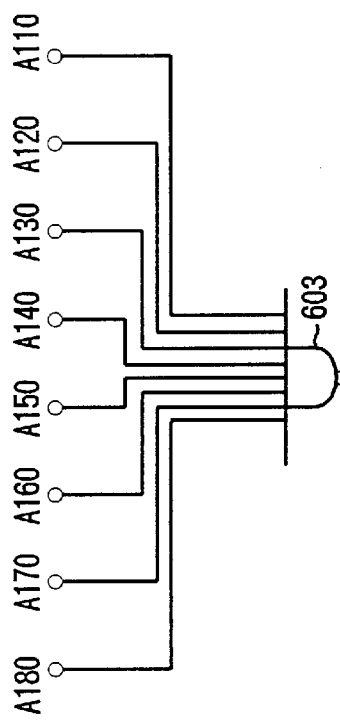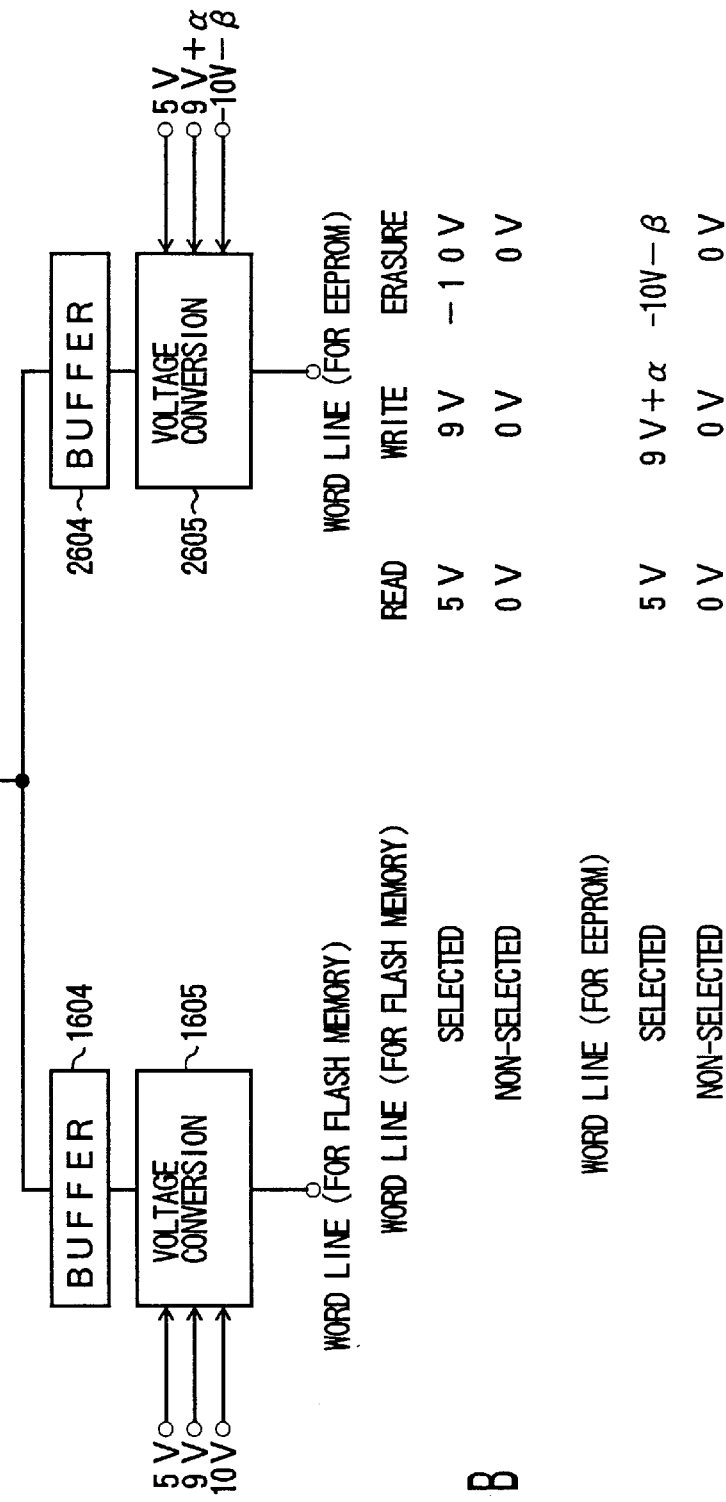
FIG. 21A
FIG. 21B

SEMICONDUCTOR MEMORY DEVICE ADAPTED FOR LARGE CAPACITY AND HIGH-SPEED ERASURE

BACKGROUND OF THE INVENTION

1. Field of the Invention

The present invention generally relates to semiconductor memory devices referred to as large scale integration (LSI) memories, and more particularly to a non-volatile semiconductor memory device.

A flash memory is known as one type of a non-volatile semiconductor memory device. Various technologies are proposed to implement a flash memory. For example, a flash memory using the channel hot electron (CHE) injection and the Fowler Nordheim tunnel is most widely used. While the flash memory of this type provides an advantage of reduction in a memory size, it has an inherent disadvantage in that erasure must occur in large units and requires a relatively long period of time. Technologies that reduce the size of units of erasure and the period of time required for erasure are available. However, such technologies are unfavorable in that the memory size and the cost are increased. Therefore, there is a demand of a non-volatile semiconductor memory device in which a flash memory of two types are assembled on one chip at a low cost, constructed such that the flash memory of a first type is characterized by a small capacity, small units of erasure and a short period of time required for erasure, and the flash memory of a second type is characterized by a large capacity, large units of erasure and a long period of time required for erasure.

2. Description of the Related Art

A description will be given of a flash memory according to the related art using the channel hot electron injection in a write mode and the Fowler Nordheim tunnel in an erasure mode.

A memory cell of the flash memory using the channel hot electron injection in a write mode and the Fowler Nordheim tunneling in an erasure mode comprises one MIS transistor. The MIS transistor is alternatively referred to as a stacked-gate transistor (SGT). FIG. 1A is a top view of the stacked-gate transistor. FIG. 1B is a sectional view thereof taken in the X-Y direction.

The stacked-gate transistor comprises a P-type silicon (Si) substrate 101, a N-type Si drain 102, a N-type Si source 103, an insulator 104 formed of SiO2 or the like, a polysilicon (poly Si) floating gate (FG) 105, an insulator 105 formed of SiO2 or the like, and a polysilicon control gate (CG) 107.

Such a stacked-gate transistor stores information by storing charge in the floating gate FG. The floating gate FG is not electrically connected to any element and is controlled by the control gate CG based on capacity coupling.

A state in which electrons exist in the floating gate FG in large quantities is defined as data "0", and a state in which electrons do not exist there is defined as data "1". A read operation reads out data "1" or data "0". A write operation stores "0" in a memory cell storing "1". An erasure operation changes a memory cell storing "0" into a memory cell storing "1".

The read operation will now be described. The control gate CG and the floating gate FG are considered to form a parallel-plate capacitor having the SiO2 insulator 106 as a dielectric and having a capacity of Ccf. Likewise, the floating gate FG and the P-type Si substrate are considered to form a parallel-plate capacitor having a capacity of Cfs.

Assuming that 0V is applied to the P-type Si substrate, a voltage of Vcg is applied to the control gate CG and a voltage of Vfg is applied to the floating gate FG, a potential Vfg of the floating gate FG is given by the following equation.

$$Vfg = \frac{Ccf}{Ccf + Cfs} Vcg + \frac{Qfg}{Ccf + Cfs} \quad (1)$$

In a read operation, Vcg is controlled to be 5V. For example, when no electrons exist in the floating gate Fg, Qfg=0 so that $$Vfg = \frac{Ccf}{Ccf + Cfs} Vcg = 0.5 \times 5V = 2.5V$$

For example, (Ccf/Ccf+Cfs)) is designed to be 0.5. Therefore, the drain-source junction of the transistor SGT conducts. If electrons exist in the floating gate FG in large quantities, Qfg has a negative value of a large magnitude. Therefore, regardless of the value of Vcg, Vfg has a negative value and the drain-source junction of the transistor SGT does not conduct. In other words, presence or absence of electrons in the floating gate FG can be detected in the form of a current in the drain-source junction by applying a voltage Vcg of 5V to the control gate CG. If the current flows, the data "1" is output. "0" is output if the current does not flow. This is how the read operation is performed.

A description will now be given of a write operation. In the write operation, the SGT transistor is configured such that the P-type Si substrate=source=0V, CG=9 V, and the drain=6V. A channel is formed on the P-type Si substrate surface underneath the floating gate FG so that electrons drift from the source to the drain. Since the channel is lost (pinched off) in the neighborhood of the drain, electrons reaching the pinch-off point move to the drain by being abruptly accelerated by a high electric field. Accordingly, electrons with high energy are generated in the neighborhood of the drain. These electrons collide with crystal lattices, thus producing hole-electron pairs. These holes and electrons are also accelerated by the high electric field so as to receive a high energy. In this way, a large quantity of hot holes and hot electrons are generated in the neighborhood of the drain. This phenomenon is called avalanche breakdown. Since CG=9V, an electric field extending from the floating gate FG to the Si substrate is produced. Attracted by this electric field, portions of the hot electrons which have higher energy than an energy barrier of the SiO2 insulator 104 are injected into the floating gate FG. This is how the channel hot electron injection occurs.

A description will now be given of an erasure operation. In the erasure operation, the transistor SGT is configured such that the P-type Si substrate=0V, CG=−10V, the drain= open, and the source=5V. In this state, the voltage between the floating gate FG and the source becomes approximately 7V. Since the thickness of the SiO2 insulator 104 is approximately 10 nm, an electric field of 7 MV/cm results so that electrons in the floating gate FG move to the source due to the tunneling.

A description will now be given of an operation of a circuit in which a plurality of transistors SGT are arranged.

FIG. 2 shows an 8-bit flash memory and some of the peripheral circuits attached to the flash memory. The construction of FIG. 2 comprises a 6V generation circuit 201, a current detection circuit 202, a 5V/0V switching circuit, switches (MIS transistors) S1, S2, Sy0, Sy1, Seb0, Seb1, Ssby00, Ssby10, Ssby01, Ssby11, and stacked-gate transistors SGT00–SGT111. The drains of the transistor SGT000 and the transistor SGT001 are connected to a sub-bit line SBL00, the drains of the transistor SGT010 and the transistor SGT011 are connected to a sub-bit line SBL01, the drains of the transistor SGT100 and the transistor SGT101 are connected to a sub-bit line SBL10, and the drains of the transistor SGT110 and the transistor SGT111 are connected to a sub-bit line SBL11. The sub-bit line SBL00 is connected to a global bit line GBL0 via the switch Ssby00, the sub-bit line SBL01 is connected to the global bit line GBL0 via the switch Ssby01, the sub-bit line SBL10 is connected to a global bit line GBL1 via the switch Ssby10, and the sub-bit line SBL11 is connected to the global bit line GBL1 via the switch Ssby11. The global bit line GBL0 is connected to a bus BL via the switch Sy0, and the global bit line GBL1 is connected to the bus BL via the switch Sy1. The bus BL is connected to the 6V generating circuit 201 via the switch S1 and is connected to the current detection circuit 202 via the switch S2. The control gates CG of the transistor SGT000 and the transistor SGT100 are connected to a word line WL0, the control gates CG of the transistor SGT001 and the transistor SGT01 are connected to a word line WL1, the control gates CG of the transistor SGT010 and the transistor SGT110 are connected to a word line WL2, and the control gates CG of the transistor SGT011 and the transistor SGT111 are connected to a word line WL3. The sources of the transistor SGT000, the transistor SGT001, the transistor SGT100 and the transistor SGT101 are connected to a source connection line SL0, and the sources of the transistor SGT010, the transistor SGT011, the transistor SGT110 and the transistor SGT111 are connected to a source connection line SL1. A group of transistors having the sources thereof connected to each other constitute an erasure block. Erasure occurs in units of erasure blocks. The transistor SGT000, the transistor SGT001, the transistor SGT100 and the transistor SGT101 constitute an erasure block EB0. The transistor SGT010, the transistor SGT011, the transistor SGT110 and the transistor SGT111 constitute an erasure block EB1. The source connection line SL0 is connected to the 5V/0V switching circuit 203 via the switch Seb0, and the source connection line SL1 is connected to the 5V/0V switching circuit 203 via the switch Seb1.

A description will be given of the read operation in this flash memory. When data in the transistor SGT000 is to be read out, the switches S2, Sy0, Ssby0 and Seb0 are closed so as to conduct, and the other switches are opened so as not to conduct. The 5V/0V switching circuit 203 is set to provide 0V. The sources of the transistor SGT000 and the transistor SGT001 are connected to 0V, and the drains thereof are connected to the current detection circuit 202. The other transistors are disconnected from the current detection circuit 202. In this state, the word lines are configured such that WL0=5V, WL1=0V. In other words, CG=5V in the transistor SGT000 and CG=0V in the transistor SGT001. The equation (1) shows that the transistor SGT001 does not conduct whether or not Qfg has a negative value. In this way, only the data in the transistor SGT000 can be detected.

A description will now be given of the write operation. When the data "0" is to be written in the transistor SGT000, the switches S1, Sy0, Ssby00, Seb0 are closed so as to conduct and the other switches are opened so as not to conduct. The 5V/0V switching circuit 203 is set to provide 0V. As a result, the sources of the transistor SGT000 and the transistor SGT001 are connected to 0V, and the drains thereof are connected to the 6V generating circuit 201. The other transistors are disconnected from the 6V generating circuit 201. In this state, the word lines are configured such that WL0=9V, WL1=0V. In other words, CG=9V and the drain=6V in the transistor SGT000, and CG=0V and the drain=6V in the transistor SGT001. Since a channel is not formed in the transistor SGT001, the avalanche breakdown does not occur so that the hot electron injection does not occur. In this way, the avalanche breakdown and the channel hot electron injection occur only in the transistor SGT000 so that the data "0" can be written selectively.

A description will now be given of the erasure operation. When the data in the erasure block EB0 is to be erased, the switch Seb0 is closed so as to conduct and the other switches are opened so as not to conduct. The 5V/0V switching circuit 203 is set to provide 5V, and the word lines are configured such that WL0=WL1=−10V. In the transistors SGT000, SGT001, SGT100, SGT011, the drains thereof are open, the control gates CG thereof are connected to −10V and the sources thereof are connected to 5V. Tunneling occurs in the four transistors SGT000, SGT001, SGT100, SGT101 so that the data therein is erased simultaneously.

FIG. 3 shows an overall construction of a 4-megabit flash memory that includes 8-bit flash memories shown in FIG. 2.

Referring to FIG. 3, a command decoding circuit 205 decodes command sets supplied via terminals A0 through A18 under the control of a control circuit 204. A state machine 206 controls the status of a 9V generating circuit 207, a −10V generating circuit 208, a 6V generating circuit 209 and a 5V/0V switching circuit 210 on the basis of a signal from the control circuit 204 and the decoded command set supplied from the command decoding circuit 205. An X decoder circuit 211 decodes address signals supplied via the terminals A11 through A18 and, on the basis of signals from the control circuit 204, the 9V generating circuit 207 and the −10V generating circuit 208, supplies a predetermined voltage to the word line. A block selection decoder 212 decodes address signals supplied via terminals A8 through A10 so as to select a sub-bit line and an erasure block on the basis of signals from the control circuit 204 and the 9V generating circuit 207. A Y decoder circuit 213 decodes address signals supplied via terminals A0 through A7 so as to select a global bit line on the basis of signals from the control circuit 204 and the 9V generating circuit 207. A sense amplifier/write circuit 214 provides the function of the current detection circuit shown in FIG. 2 and also performs a write operation. A memory unit 215 is composed of a plurality of erasure blocks each having the construction as shown in FIG. 2.

In a flash memory composed of the stacked-gate transistors SGT, only one transistor is necessary to store 1 bit so that a memory having a large capacity is suitably produced. However, such a flash memory has an inherent problem of over erasure. In an erasure operation of the stacked-gate transistor SGT, electrons stored in the floating gate FG are removed therefrom. However, if the electrons are removed to an excessive degree, holes may appear in the floating gate FG so that the floating gate may become positively charged. This phenomenon is referred to as over erasure. For example, consider a case in which data is read out from the transistor SGT000 when the transistor SGT001 is in an over erasure state. The equation (1) shows that, if Qfg has a positive value, then a current flows even if Vcg is equal to 0V. In other words, the transistor SGT001 conducts even when WL=0V (non-selection). Ideally, a current does not flow in the bus BL when the data in the transistor SGT000 is "0". However, since a current flows due to the over erasure in the transistor SGT001, a wrong output indicating the data is "1" is provided by the current detection circuit 202. In order to avoid the over erasure, a flash memory makes use of an algorithm whereby the speed of erasure is controlled and a level of erasure is detected after each short spell of erasure repeated several times before complete erasure. For this reason, a relatively long erasure time is required.

Further, since the switches Seb0, Seb1, Ssby00, Ssby10, Ssby01, Ssby11 occupy a relatively large area, the number of transistors in one erasure block should be increased in order to prevent the chip size from becoming excessively large. For this reason, the storage capacity of an erasure block is relatively large. A typical flash memory has an erasure unit of 64 kbytes.

While an ordinary flash memory has an advantage of a relatively small memory cell size, enabling a memory having a relatively large capacity to be easily produced, it has a disadvantage in that an erasure unit is relatively large and a relatively long period of time is required for an erasure operation.

Accordingly, a flash memory of a small storage capacity and providing the benefits of a small erasure unit and a short erasure time, and a flash memory having a large erasure unit and a long erasure time but providing the benefit of a large storage capacity may be assembled on one chip so as to provide an industrially useful semiconductor memory device.

FIG. 4 shows a memory cell according to a first construction (basic construction) in which the problem of over erasure is resolved and the erasure time is reduced. FIG. 4A is a top view of the memory cell according to the first construction, and FIG. 4B is a lateral view thereof taken in the X-Y direction. Referring to FIGS. 4A and 4B, the memory cell comprises a P-type Si substrate 301, an N-type Si drain 302, an N-type Si source 303, an insulator 304 formed of SiO2 or the like, a polysilicon floating gate FG 305, an insulator 306 formed of SiO2 or the like, and a polysilicon control gate CG 307. These elements constitute a stacked-gate transistor SGT (TrN). The memory cell also comprises an N-type Si drain 308, an N-type Si source 309, an insulator 310 formed of SiO2 or the like, and a polysilicon gate 311. These elements constitute a MIS transistor (TrS). The drain of TrN is electrically connected to the source of TrS in a junction 312. TrS and TrN form an EEPROM. Hereinafter, such a memory cell will be referred to as an MC1.

As is obvious from the above-described construction, the transistor TrS is different from the transistor TrN in that it does not have a floating gate controlled by capacity coupling. Accordingly, unlike the transistor TrN, the problem of over erasure does not exist in the transistor TrS.

The operation of the transistor TrN is the same as the operation already described so that the description thereof is omitted. The transistor TrS is controlled as described below. First, a read operation will be described. When the memory cell MC1 is to be selected, a voltage of 5V is applied to the gate 311. This causes the transistor TrS to conduct so that the data in the transistor TrN can be detected by detecting whether the transistor TrN conducts. When the memory cell MC1 is not selected, a voltage of 0V is applied to the gate 311. This causes the transistor TrS not to conduct so that the memory conduct does not conduct even if over erasure occurs in the transistor TrN. The transistor TrS is a single-gate transistor and does not conduct improperly due to over erasure. Therefore, even if the transistor TrN conducts due to over erasure, the non-selected memory cell MC1 remains non-conductive. When selected, the memory cell MC1 becomes conducting or non-conducting depending on the status of the transistor TrN.

A description will now be given of a write operation. A voltage of 9V is applied to the gate 307. A voltage of 10V is applied to the gate 311 and a voltage of 7V is applied to the drain 308. Then, a voltage of 6V occurs in the source 309. Since the drain 302 is at the same potential as the source 309, the drain 302 is connected to 6V. Since the control gate 307 is at 9V, the CHE injection occurs.

A description will be given of an erasure operation. A voltage of 0V is applied to the gate 311. Since the drain 302 is at the same potential as the source 309, the drain 302 becomes open. By applying -10V to the control gate 307 and applying 5V to the source 303, the FN tunneling occurs.

In an actual implementation, it is inefficient to generate various voltages. Accordingly, the following improvement may be made.

The transistor TrS may be controlled using known voltages 9V, 5V, 0V, -10V for controlling the control gate CG.

First, the read operation will be described. When the memory cell MC1 is to be selected, the voltage of 5V is applied to the gate 311. This causes the transistor TrS to conduct so that the data in the transistor TrN can be determined by detecting whether the transistor TrN conducts. When the memory cell MC1 is not selected, the voltage of 0V is applied to the gate 311. This causes the transistor TrS not to conduct so that an over erasure in the transistor TrN does not affect the memory cell unfavorably.

A description will be given of the write operation. As described already, a considerable drain current flows when data is written in a stacked-gate transistor (TrN). Therefore, if the transistor TrS has a small transconductance, the source of TrS produces a voltage drop, causing the drain voltage of TrN to drop and disabling a write operation. Due to a voltage drop, the voltage of 6V does not occur in the drain 302 of a memory cell as shown in FIG. 4, merely by applying 9V provided by the existing peripheral circuit to the gate 311 and applying 6V provided by the existing peripheral circuit to the drain 308.

Accordingly, by configuring Vth (threshold value) of the transistor TrS to be 0V or by configuring the gate width of the transistor TrS to be larger than that of the transistor TrN so as to increase the transconductance, as shown in FIG. 5, it is ensured that the voltage of 6V occurs in the drain 302 even when 9V is applied to the gate 311 and 6V is applied to the drain 308. In FIG. 5, those components that are the same as the corresponding components of FIG. 4 are designated by the same reference numerals, and the description thereof is omitted.

A description will now be given of the erasure operation. Irrespective of the level of the voltage applied to the gate 311, the drain of TrN becomes open by opening the drain 308. In this way, the memory cell MC1 can be operated without a need for generating an additional voltage.

With the operation described above, the same voltage can be applied to the gate of the transistor TrS and the control gate CG of the transistor TrN. Accordingly, the circuit can be simplified by electrically connecting the control gate CG of the transistor TrN to the gate of the transistor TrS.

The transistor TrN may be identical to the memory cell of an ordinary flash memory or may have the same construction produced by the same process. In this case, the memory cell MC1 can coexist on the same chip with the ordinary flash memory cell (hereinafter, referred to as an MC2) without introducing any change in or addition to the existing fabrication process. FIG. 6 shows a construction in which MC1 coexists with MC2. In FIG. 6, those components that are the same as the corresponding components of FIG. 4 are designated by the same reference numerals and the description thereof is omitted. The construction of FIG. 6 includes a semiconductor memory unit 501 consisting of the memory cell MC1, in which the problem of over erasure does not occur. However, the cell size thereof is relatively large. The construction of FIG. 6 also includes a semiconductor memory unit 502 consisting of the memory cell MC2. The flash memory MC2 is a semiconductor memory cell of the same structure as the transistor TrN of the memory cell MC1. In the memory cell MC2, the problem of over erasure occurs. However, the cell size is relatively small.

Consider a case where a control program and the parameters thereof are stored in a ROM which is associated with a microcomputer. The control program comprises a large quantity of information but does not need to be updated frequently. The parameters for the control program do not comprise a large quantity of information but need to be updated frequently. A memory area that stores the control program may have a relatively long erasure time. In contrast, the shorter the erasure time of a memory area that stores the parameters, the better. By forming the area for storing the control program using a semiconductor memory cell of one type and forming the area for storing the parameters using a semiconductor memory cell of another type, a ROM for microcomputer control superior to the one according to the related art is provided.

For example, a control program for a car engine may be stored in a semiconductor memory device such that the program for engine control is stored in the semiconductor memory cell of one type, and the parameters related to mileage and horsepower are stored in the semiconductor memory cell of another type so that it can be updated frequently. Thus, a control ROM that meets the needs of users is implemented.

Japanese Laid-Open Patent Application 5-275657It discloses a semiconductor memory device in which memory cell matrices of different kinds are assembled on the same chip.

FIG. 7 shows an arrangement of the memory matrices shown in Japanese Laid-Open Patent Application 5-275657. The semiconductor memory device comprises an EEPROM cell matrix 31 and a flash EEPROM cell matrix 32. The drain (bit) lines C1–C3 correspond to the drain lines C1'–C3', and R1–R6 indicate row lines. Due to a difference in drain withstand voltage between the matrices 31 and 32, the drain lines C1–C3 and C1'–C3' are disconnected (open) from each other. Therefore, an operation in the EEPROM cell matrix 31 does not affect the flash matrix 32. Likewise, an operation in the flash matrix 32 does not affect the EEPROM cell matrix 31.

FIG. 8 shows another arrangement of memory matrices shown in Japanese Laid-Open Patent Application 5-275657. In this arrangement, depletion transistors 41–43 are connected to the drain lines C1–C3, respectively, between the EEPROM cell matrix 31 and the flash EEPROM cell matrix 32. A backgate effect is produced by controlling the gate voltage of the transistors 41–43 in order to ensure that an operation in the EEPROM cell matrix 31 does not affect the EEPROM cell matrix 32. Likewise, it is ensured that an operation in the flash matrix 32 does not affect the EEPROM cell matrix 31.

However, according to the construction shown in Japanese Laid-Open Patent Application 5-275657, due to a difference in bias voltage between the EEPROM cell matrix 31 and the flash EEPROM cell matrix 32, peripheral circuits cannot be easily shared between the matrices.

If the bit lines of the EEPROM cell matrix 31 and the bit lines of the flash EEPROM cell matrix 32 are electrically disconnected from each other as shown in FIG. 7, column decoders, sense amplifiers, write/erasure circuits for respective matrices are needed, causing the chip area to be increased. In other words, while the related art discloses how memory matrices of different kinds coexist, it does not teach how peripheral circuits can be shared.

FIG. 8 shows a construction in which the bit lines are selectively connected to each other or disconnected from each other using depletion transistors. However, construction shown in FIG. 8 is possible only under certain conditions characterized by a specific combination of operation voltages. Further, the construction of FIG. 8 has disadvantages in that it lacks flexibility in design and the fabrication process is extended due to an addition of depletion transistors.

SUMMARY OF THE INVENTION

Accordingly, an object of the present invention is to provide a semiconductor memory device in which the aforementioned problems are eliminated.

Another and more specific object of the present invention is to provide an industrially useful semiconductor memory device in which a flash memory characterized by a small capacity, a small erasure unit and a short erasure time, and a flash memory characterized by a large capacity, a large erasure unit and a long erasure time are assembled on a chip at a low cost, and in which the flash memories share peripheral circuits.

The aforementioned objects can be achieved by a semiconductor memory device comprising a first semiconductor memory cell and a second semiconductor memory cell, wherein said first semiconductor memory cell comprises: a single-gate transistor having a first substrate of a first conductivity type, a first gate, a first area of a second conductivity type and a second area of the second conductivity type; and a first stacked-gate transistor provided on the same chip as said single-gate transistor and having a second gate, a third gate, a third area of the second conductivity type and a fourth area of the second conductivity type, the second gate of said first stacked-gate transistor storing data by storing charge therein, and the second area of said single-gate transistor being electrically connected to the third area of said first stacked-gate transistor, and said second semiconductor memory cell comprises a second stacked-gate transistor having said first substrate, a fourth gate, a fifth gate, a fifth area of the second conductivity type and a sixth area of the second conductivity type, and wherein in said first semiconductor memory cell, a data read operation is conducted such that a first voltage is applied to the first gate and a second voltage is applied to the third gate so that a current between the first area and the fourth area is detected, a data write operation is conducted such that a third voltage higher than the first voltage is applied to the first gate, a fourth voltage higher than the second voltage is applied to the third gate, and a fifth voltage is applied to the first area, and a data erasure operation is conducted such that a sixth voltage lower than the second voltage is applied to the third gate and a seventh voltage is applied to the fourth area so that the charge is drawn from the second gate, and in said second semiconductor memory cell, a data read operation is conducted such that the second voltage is applied to the fifth gate so that a current between the fifth area and the sixth area is detected, a data write operation is conducted such that the fourth voltage is applied to the fifth gate and the fifth voltage is applied to the fifth area so that charge is injected into the fourth gate, and a data erasure operation is conducted such that the sixth voltage is applied to the fifth gate and the seventh voltage is applied to the sixth area so that the charge is drawn from the fourth gate.

According to the semiconductor memory device of the present invention, the first stacked-gate transistor constituting the first semiconductor memory cell and the second stacked-gate transistor constituting the second semiconductor memory cell can be operated using the same voltages.

The aforementioned objects can also be achieved by a semiconductor memory device comprising a first semiconductor memory cell and a second semiconductor memory cell, wherein said first semiconductor memory cell comprises: a single-gate transistor having a first substrate of a first conductivity type, a first gate, a first area of a second conductivity type and a second area of the second conductivity type; and a first stacked-gate transistor provided on the same chip as said single-gate transistor and having a second gate, a third gate, a third area of the second conductivity type and a fourth area of the second conductivity type, the second gate of said first stacked-gate transistor storing data by storing charge therein and the second area of said single-gate transistor being electrically connected to the third area of said first stacked-gate transistor, and said second semiconductor memory cell comprises a second stacked-gate transistor having said first substrate, a fourth gate, a fifth gate, a fifth area of the second conductivity type and a sixth area of the second conductivity type, and wherein in said first semiconductor memory cell, a data read operation is conducted such that a first voltage is applied to the first gate and a second voltage is applied to the third gate so that a current between the first area and the fourth area is detected, a data write operation is conducted such that a third voltage higher than the first voltage is applied to the first gate, a fourth voltage higher than the second voltage is applied to the third gate, a fifth voltage is applied to the first area so that charge is injected into the second gate, a data erasure operation is conducted such that a sixth voltage lower than the second voltage is applied to the third gate and a seventh voltage is applied to the fourth area so that the charge is drawn from the second gate, and in said second semiconductor memory cell, a data read operation is conducted such that the second voltage is applied to the fifth gate so that a current between the fifth area and the sixth area is detected, a data write operation is conducted such that the fourth voltage is applied to the fifth gate and the fifth voltage is applied to the fifth area so that charge is injected into the fourth gate, and a data erasure operation is conducted such that the sixth voltage is applied to the fifth gate, the seventh voltage is applied to the sixth area so that the charge is drawn from the fourth gate.

According to this aspect of the invention, the single-gate transistor of the first semiconductor memory cell, the first stacked-gate transistor and the second stacked-gate transistor can be operated using the same voltages.

The aforementioned objects can also be achieved by a semiconductor memory device comprising a first semiconductor memory cell and a second semiconductor memory cell, wherein said first semiconductor memory cell comprises: a single-gate transistor having a first gate; and a first stacked-gate transistor provided on the same chip as said single-gate transistor and having a second gate and a third gate, the second gate of said first stacked-gate transistor storing data by storing charge therein, and a source of said single-gate transistor being electrically connected to a drain of said first stacked-gate transistor, and said second semiconductor memory cell comprises a second stacked-gate transistor having a fourth gate and a fifth gate, and wherein the first gate and the third gate of said first semiconductor memory cell are controlled to have an identical electric potential.

According to this aspect of the invention, the circuit can be simplified by electrically connecting the first gate of the single-gate transistor to the third gate of the first stacked-gate transistor.

The aforementioned objects can also be achieved by a semiconductor memory device comprising a first semiconductor memory cell and a second semiconductor memory cell, wherein said first semiconductor memory cell comprises: a single-gate transistor having a first gate; and a first stacked-gate transistor provided on the same chip as said single-gate transistor and having a second gate and a third gate, the second gate of said first stacked-gate transistor storing data by storing charge therein, and a source of said single-gate transistor being electrically connected to a drain of said first stacked-gate transistor, and said second semiconductor memory cell comprises a second stacked-gate transistor having a fourth gate and a fifth gate, and wherein the first gate prevents an erroneous current detection due to over erasure in said first stacked-gate transistor, based on a predetermined voltage, said single-gate transistor further comprises a first area of a first conductivity forming a source in a first semiconductor substrate of a second conductivity, and a second area of the first conductivity forming a drain in the first semiconductor substrate, said first stacked-gate transistor further comprises a third area of the first conductivity forming a source in the first semiconductor substrate and a fourth area of the first conductivity forming a drain in the first semiconductor substrate, the second area being electrically connected to the third area, said second stacked-gate transistor further comprises a fifth area of the second conductivity forming a source in the first semiconductor substrate and a sixth area of the second conductivity forming a drain in the first semiconductor substrate, and the second area of said single-gate transistor constituting said first semiconductor memory cell is formed to be integral with the third area of said first stacked-gate transistor.

According to this aspect of the invention, the source area of the single-gate transistor and the drain area of the first stacked-gate transistor are integrated so that the size of the semiconductor memory device is reduced.

The aforementioned objects can also be achieved by a semiconductor memory device comprising a first memory cell array and a second memory cell array provided on the same substrate, wherein said first memory cell array being constructed such that a total of i semiconductor memory cells each having a first function are arranged in a first direction so as to constitute a word line of said first memory cell array and a total of j semiconductor memory cells each having the first function are arranged in a second direction so as to constitute a bit line of said first memory cell array, said second memory cell array being constructed such that a total of k semiconductor memory cells each having a second function are arranged in the first direction so as to constitute a word line of said second memory cell array and a total of l semiconductor memory cells each having the second function are arranged in the second direction so as to constitute a bit line of said second memory cell array, and said first memory cell array and said second memory cell array share at least one of the bit lines.

According to this aspect of the invention, various peripheral circuits can be shared between the first memory cell array and the second memory cell array so that the chip size is reduced.

In further accordance with the invention, i may be equal to k, so that said first memory cell array and said second memory cell array share all of the bit lines.

The semiconductor memory cells having the second function may be arranged such that k=i/n and l=m*n, and said first memory cell array and said second memory cell array share all of the bit lines.

According to this aspect of the invention, the first memory cell array and the second memory cell array can share all of the bit lines even when the X-direction size of the first memory cell and the X-direction size of the second memory cell are different.

The semiconductor memory cell having the first function may comprise: a single-gate transistor having a first substrate of a first conductivity type, a first insulating film provided on the first substrate, a first gate provided on the first insulating film, a first area of a second conductivity type forming a source in the first substrate, and a second area of the second conductivity type forming a drain in the first substrate, a first stacked-gate transistor having the first substrate, a second insulating film provided on the first substrate, a second gate provided on the second insulating film, a third insulating film provided on the second gate, a third gate provided on the third insulating film, a third area of the second conductivity forming a source in the first substrate, and a fourth area of the second conductivity forming a drain in the first substrate, and wherein said semiconductor memory cell having the second function comprises: a second stacked-gate transistor having the first substrate, a fourth insulating film provided on the second substrate, a fourth gate provided on the fourth insulating film, a fifth insulating film provided on the fourth gate, a fifth gate provided on the fifth insulating film, a fifth area of the second conductivity forming a source in the first substrate, and a sixth area of the second conductivity forming a drain in the first substrate.

According to this aspect of the invention, the storage capacity of the first memory cell array and the storage capacity of the second memory cell array can be modified in a wiring process by changing the method of connecting the first semiconductor memory cell to the bit line.

The second area may be electrically connected to the third area, and the first area and the fifth area may be connected to the respective bit lines.

According to this aspect of the invention, the semiconductor memory cell having the first function is configured to provide the first function so that the semiconductor memory device having the first function and the second function results.

The third area and the fifth area may be connected to the respective bit lines.

According to this aspect of the invention, the semiconductor memory cell having the first function is configured to provide the second function so that the semiconductor memory device having only the second function results.

A selection may be available in a process of fabricating said semiconductor memory device between a first configuration in which the second area and the third area of the semiconductor memory cell having the first function are electrically connected to each other, and a second configuration in which the third area is connected to the associated bit line.

According to this aspect of the invention, the storage capacity of the first memory cell array and the storage capacity of the second memory cell array can be modified in a wiring process by changing the method of connecting the first semiconductor memory cell to the bit line.

The first memory cell array and said second memory cell array may share at least one of the bit lines.

According to this aspect of the invention, the first memory cell array and the second memory cell array can share some of the bit lines at periodical intervals.

The aforementioned objects can also be achieved by a semiconductor memory device comprising a first memory cell array and a second memory cell array provided on the same substrate, wherein said first memory cell array being constructed such that a total of i semiconductor memory cells each having a first function are arranged in a first direction so as to constitute a word line of said first memory cell array and a total of j semiconductor memory cells each having the first function are arranged in a second direction so as to constitute a bit line of said first memory cell array, said second memory cell array being constructed such that a total of k semiconductor memory cells each having a second function are arranged in the first direction so as to constitute a word line of said second memory cell array and a total of l semiconductor memory cells each having the second function are arranged in the second direction so as to constitute a bit line of said second memory cell array, and said first memory cell array and said second memory cell array share at least one of the word lines.

According to this aspect of the invention, the first memory cell array and the second memory cell array can share the word lines.

The aforementioned objects can also be achieved by a semiconductor memory device comprising first semiconductor memory cells each having a first function and second semiconductor memory cells each having a second function, wherein the first semiconductor memory cells and the second semiconductor memory cells have continuous addresses.

According to this aspect of the invention, the memory cell capable of high-speed erasure and the ordinary memory cell can be arranged in a continuous address space.

The aforementioned objects can also be achieved by a semiconductor memory device comprising first semiconductor memory cells each having a first function and second semiconductor memory cells each having a second function, wherein a first word line decoder for driving the first semiconductor memory cells and a second word line decoder for driving the second semiconductor memory cells are identical.

According to this aspect of the invention, the memory cell capable of high-speed erasure and the ordinary memory cell can share the word decoder.

The aforementioned objects can also be achieved by a semiconductor memory device comprising first semiconductor memory cells each having a first function and second semiconductor memory cells each having a second function, wherein a first word line decoder for driving the first semiconductor memory cells and a second word line decoder for driving the second semiconductor memory cells share a decoding unit.

According to this aspect of the invention, the memory cell capable of high-speed erasure and the ordinary memory cell can share some of the circuits (decoding unit).

BRIEF DESCRIPTION OF THE DRAWINGS

Other objects and further features of the present invention will be apparent from the following detailed description when read in conjunction with the accompanying drawings, in which:

FIGS. 21A and 21B show how the method of FIG. 20 is implemented.

DETAILED DESCRIPTION OF THE PREFERRED EMBODIMENTS

Figure 4A:
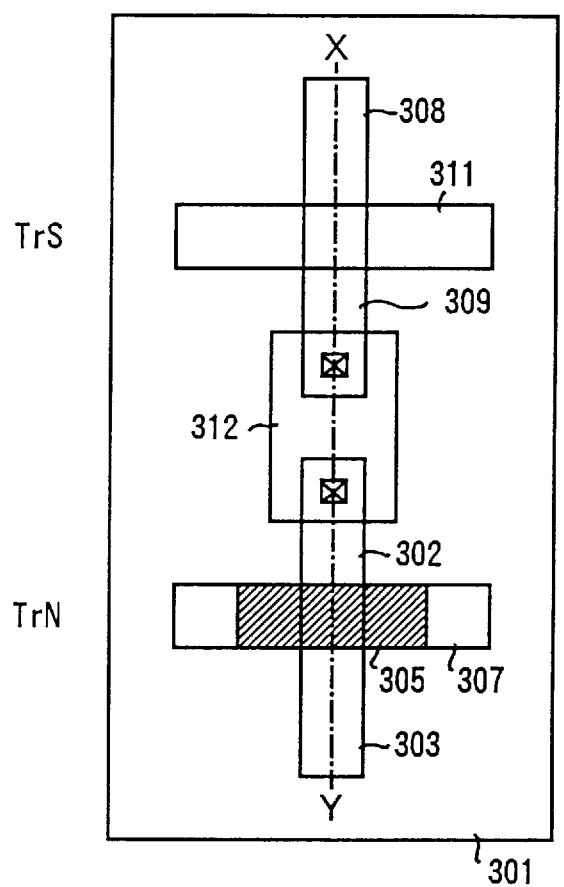
FIGS. 4A and 4B show a memory cell according to a first construction in which the problem of over erasure is resolved.
Figure 4B:
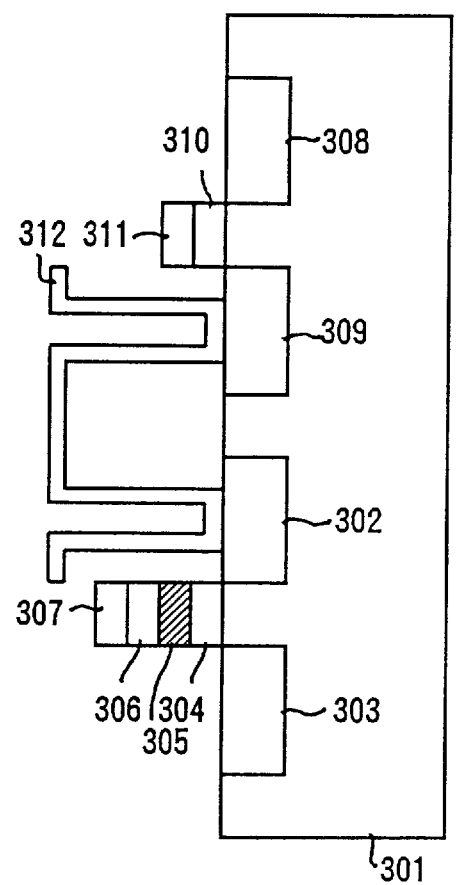
Figure 6:
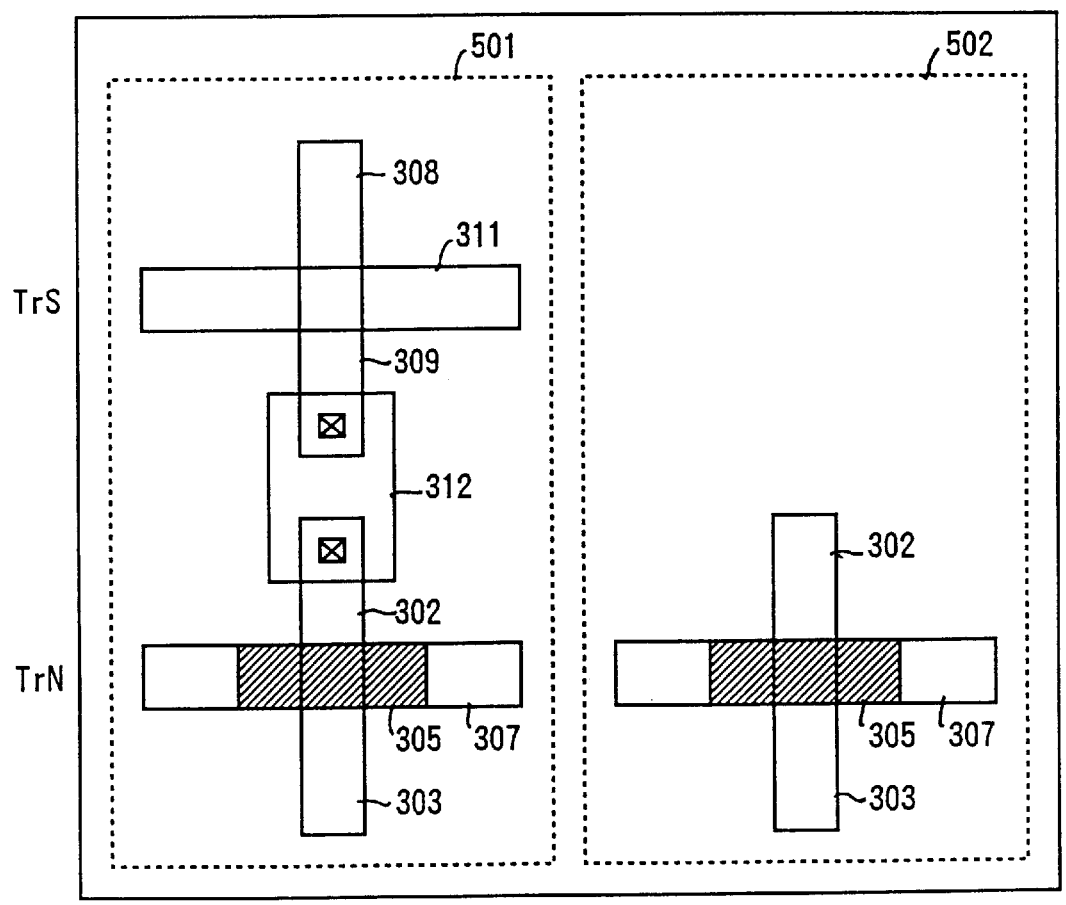
FIG. 6 shows a construction in which the memory cell having the problem of over erasure eliminated and an ordinary flash memory cell coexist.
Figure 7:
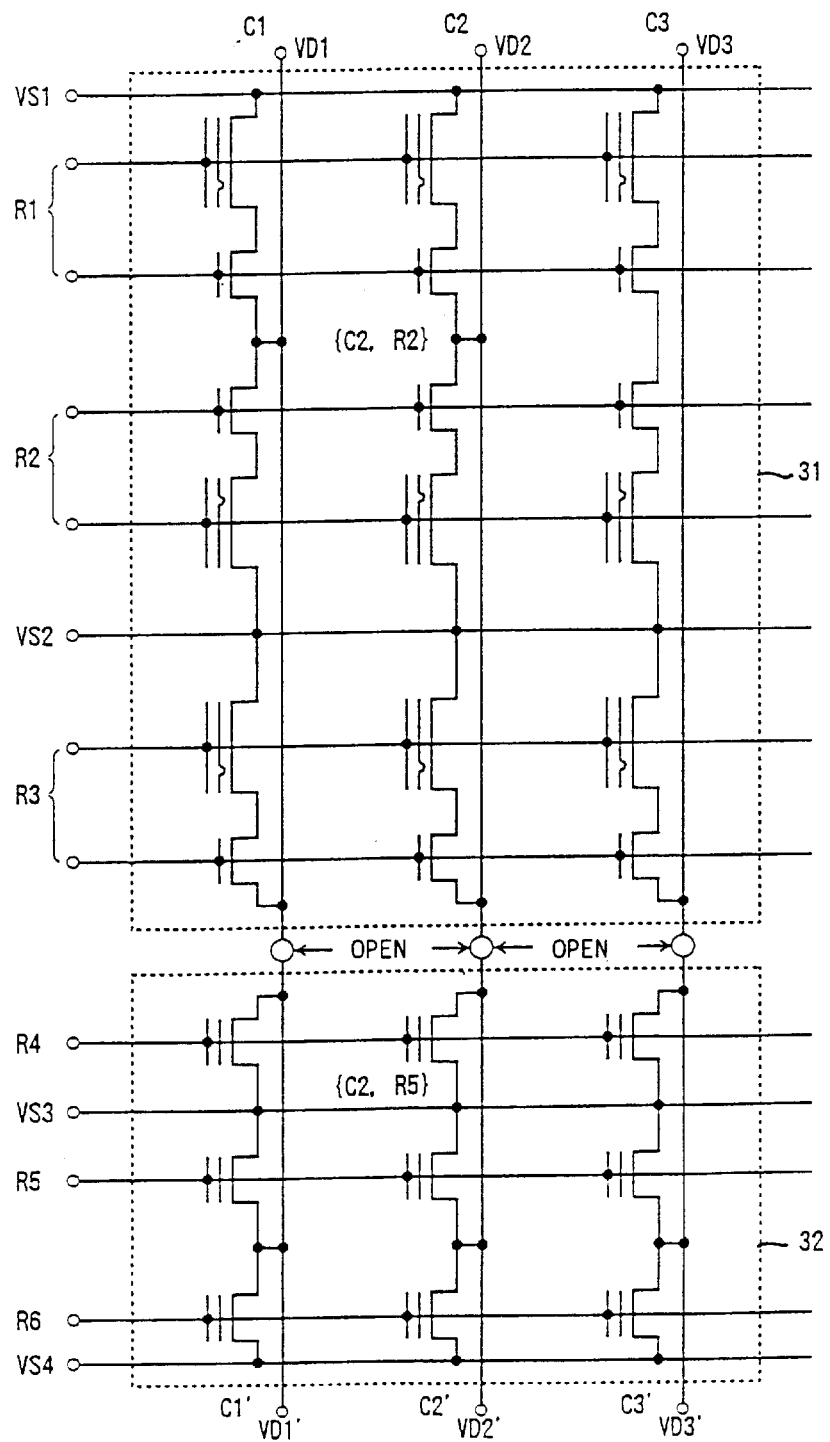
FIG. 7 shows a construction according to the related art in which memory cell matrices of different types coexist.
Figure 8:
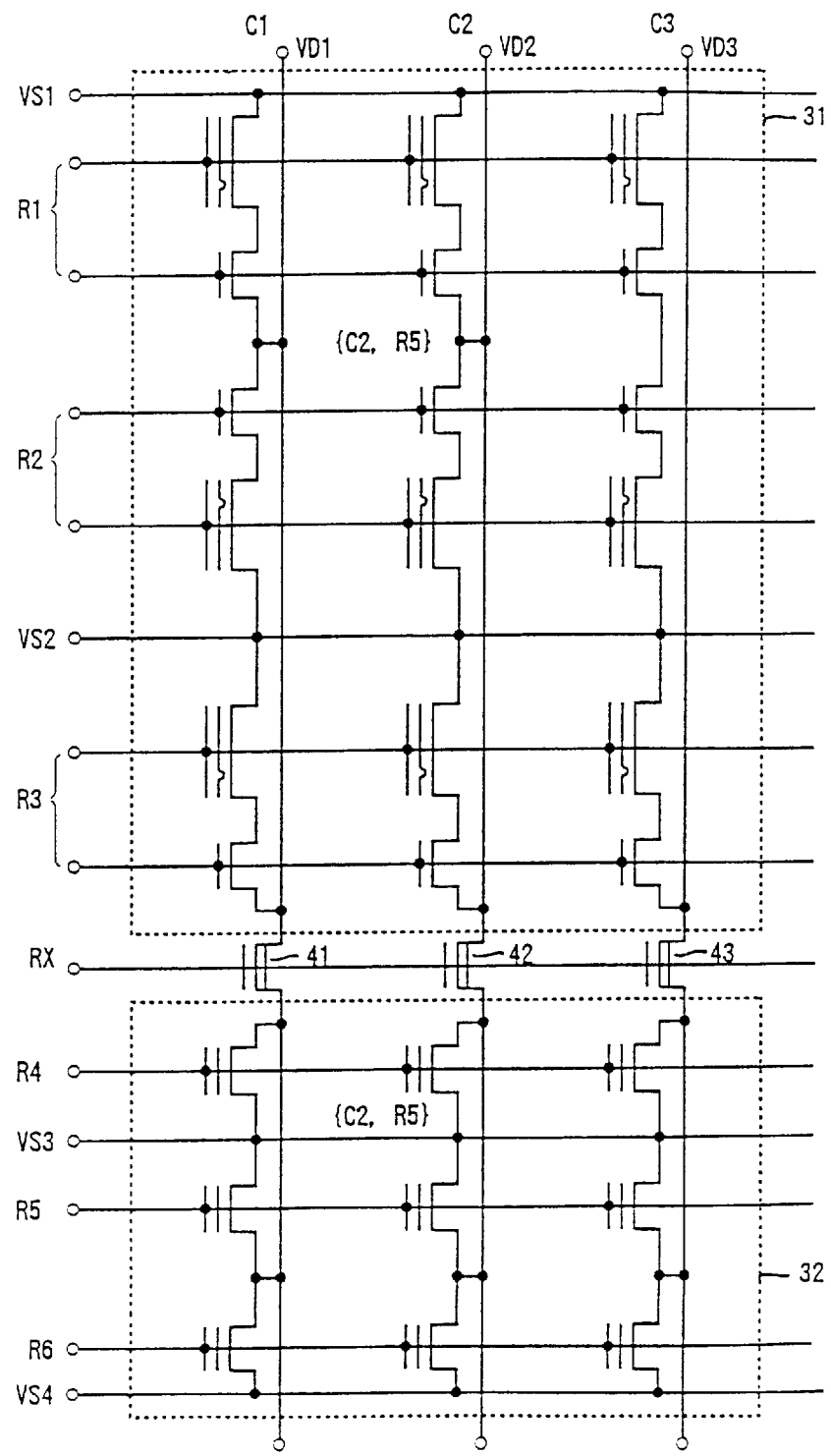
FIG. 8 shows another construction according to the related art in which memory cell matrices of different types coexist.
Figure 9:
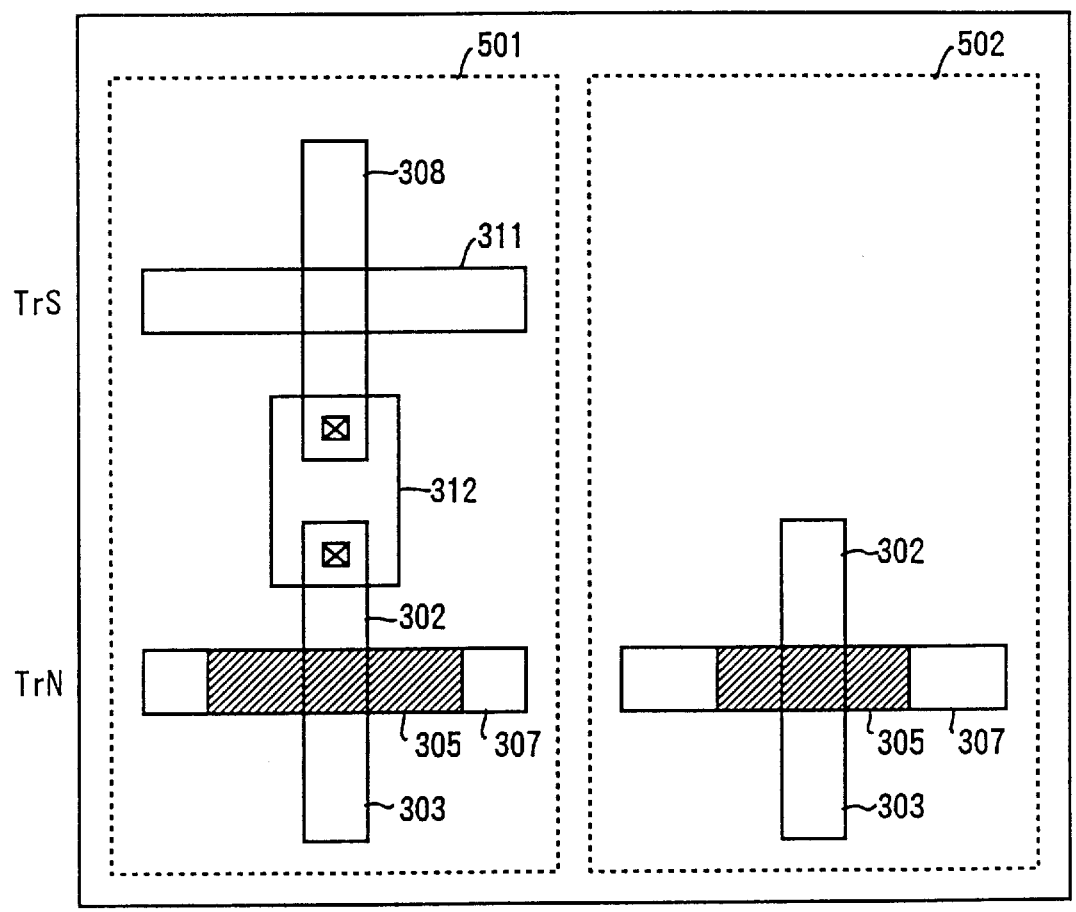
FIG. 9 shows a memory cell according to a first construction of the present invention.

In order to achieve the aforementioned objects, that is, in order to share peripheral circuits between the semiconductor memory unit consisting of the memory cell MC1 according to the related art and the semiconductor memory unit consisting of the memory cell MC2, the semiconductor memory unit consisting of memory cell MC1 and the semiconductor memory unit consisting of the memory cell MC2 may be operated using the same voltages. Actually, the stacked-gate transistor SGT of the memory cell MC1 may be operated using the same voltage as the stacked-gate transistor SGT of the memory cell MC2, if the stacked-gate transistors SGT have the same structure and dimension. Operating the stacked-gate transistor SGT of the memory cell MC1 and the stacked-gate transistor SGT of the memory cell MC2 of the equal structure and dimension, using the same operating voltages, resolves the problem of over erasure, thus eliminating the need to repeat detection of the level of erasure and increasing the erasure speed of the memory cell MC1. However, the increase in the speed is limited. Improvement in the erasure speed is enhanced by ensuring that the capacity Ccf of the stacked-gate transistor SGT of the memory cell MC1 is larger than that of the memory cell MC2 so that the erasure in the memory cell MC1 occurs at a higher speed. Improvement in erasure speed under the condition of the same dimension is possible by configuring an insulator between CG and FG of the memory cell MC1 to have a dielectric constant higher than that of the memory cell MC2 so as to increase the capacity Ccf. The capacity Ccf can be increased without a change in and an addition to the fabrication process if the width of the floating gate FG of the transistor TrN of the memory cell MC1 is increased as shown in FIG. 9. In FIG. 9, those components that are the same as the corresponding components of FIGS. 4 and 6 are designated by the same reference numerals and the description thereof is omitted.

As described above, it is possible to ensure that the stacked-gate transistor SGT of the memory cell MC1 and the stacked-gate transistor SGT of the memory cell MC2 are operated using the same voltage, while ensuring that erasure occurs at a high speed in the memory cell MC1. Further, the transistor TrS of the memory cell MC1 can be operated using the same voltage same as the stacked-gate transistors SGT. It is also conceivable to electrically connect the control gate CG of the transistor TrN to the gate of the transistor TrS of the memory cell MC1.

Figure 10A:
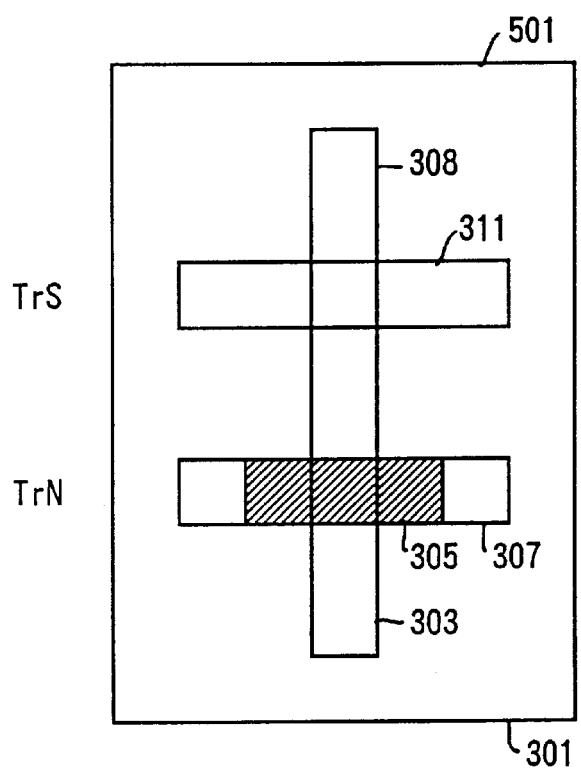
FIG. 10A is a top view of a memory cell according to a second construction of the present invention.
Figure 10B:
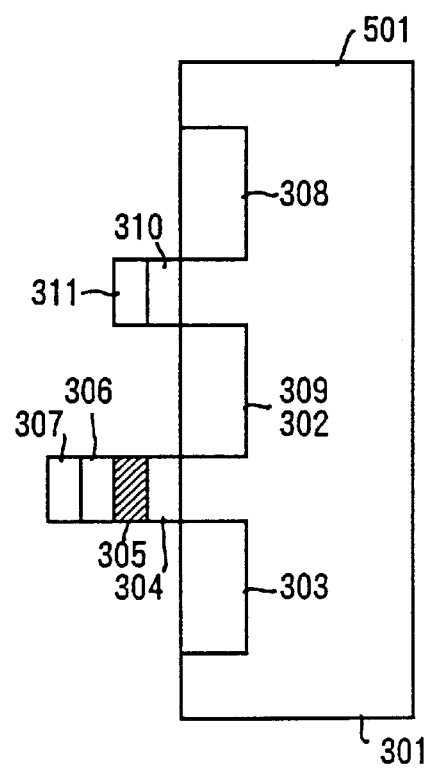
FIG. 10B is a lateral sectional view of the memory cell according to the first construction of the present invention.

As shown in FIG. 10, it is possible to integrate the source area of transistor TrS and the drain area of the transistor TrN. In this way, the size of the semiconductor memory device is reduced. In FIG. 10, those components that are identical to the corresponding components of FIG. 4 are designated by the same reference numerals and the description thereof is omitted.

Figure 11:
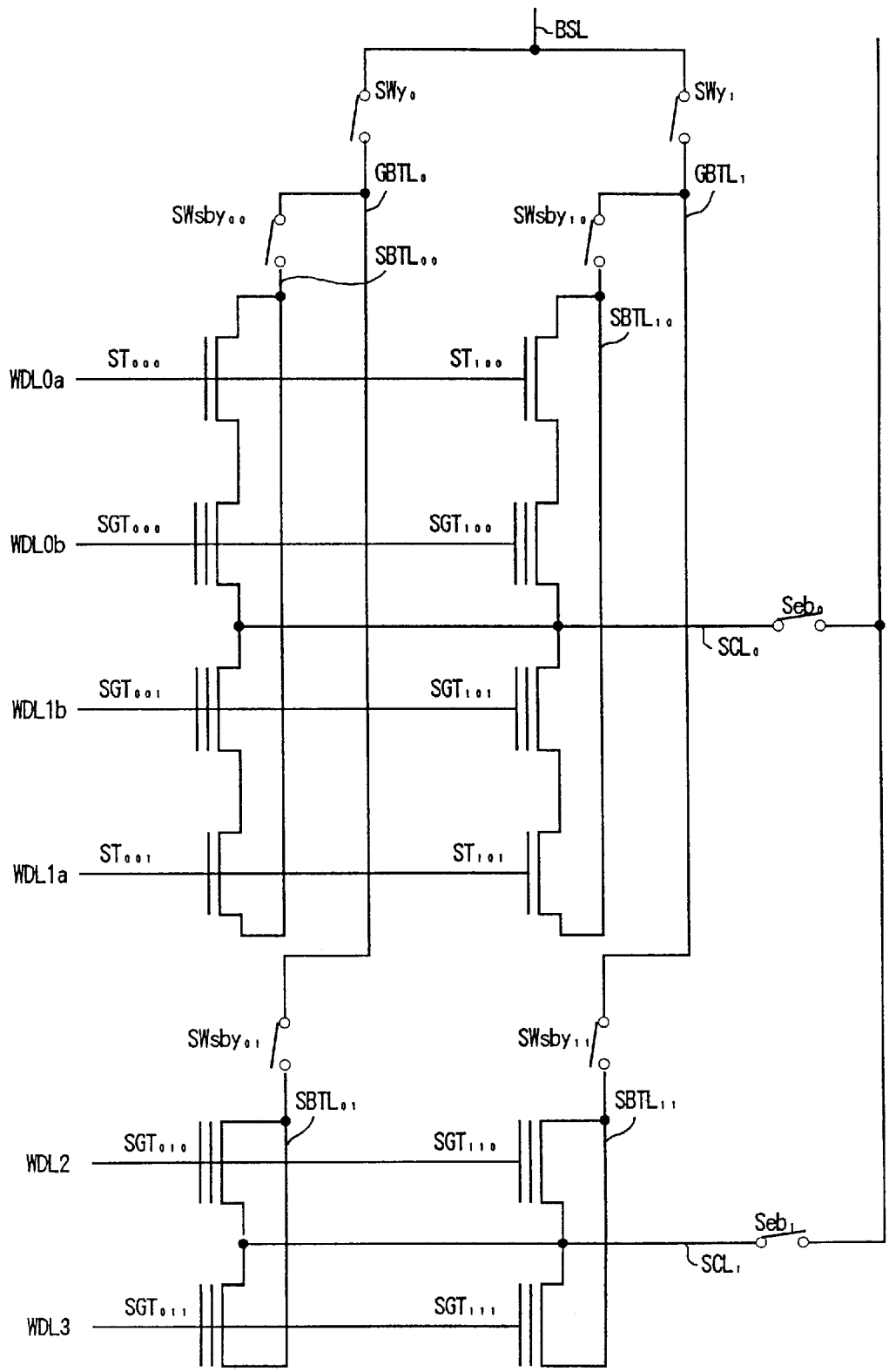
FIG. 11 shows a memory cell array according to the present invention.

In this way, it is possible to assemble semiconductor memory cell arrays of different functions on the same chip. FIG. 11 shows a specific implementation of such an assembly. The transistor ST000, SGT000, ST001, SGT001, ST100, SGT100, ST101, SGT101 constitute a flash memory unit capable of high-speed erasure. The transistors SGT010, SGT011, SGT110, SGT111 constitute an ordinary flash memory department. SWy0, SWy1, SWsby00, SWsby10, SWsby01, SWsby11 indicate switches (MIS transistors). The drains of the transistors ST000 and ST001 are connected to the sub-bit line SBTL00, the drains of the transistors ST100 and ST101 are connected to the sub-bit line SBL10, the drains of the transistors SGT010 and SGT011 are connected to the sub-bit line SBTL01, and the drains of the transistors SGT110 and SGT111 are connected to the sub-bit line SBL11. The bit line SBTL00 is connected to the global bit line GBTL0 via the switch SWsby 00, the sub-bit line SBTL01 is connected to the global bit line GBTL0 via the switch SWsby01, the sub-bit line SBTL10 is connected to the global bit line GBTL1 via the switch SWsby10, and the sub-bit line SBTL11 is connected to the global bit line GBTL1 via the switch SWsby 11. The global bit line GBTL0 is connected to the bus BSL via the switch SWy0, and the global bit line GBTL1 is connected to the bus BSL via the switch SWy1. Various peripheral circuits including the 6V generating circuit, the electric current detection circuit, the 5V/0V switching circuit can be shared between the flash memory unit capable of high-speed erasure and the ordinary flash memory unit, and the chip size is reduced, by constituting the memory cell array as described above.

Figure 12:
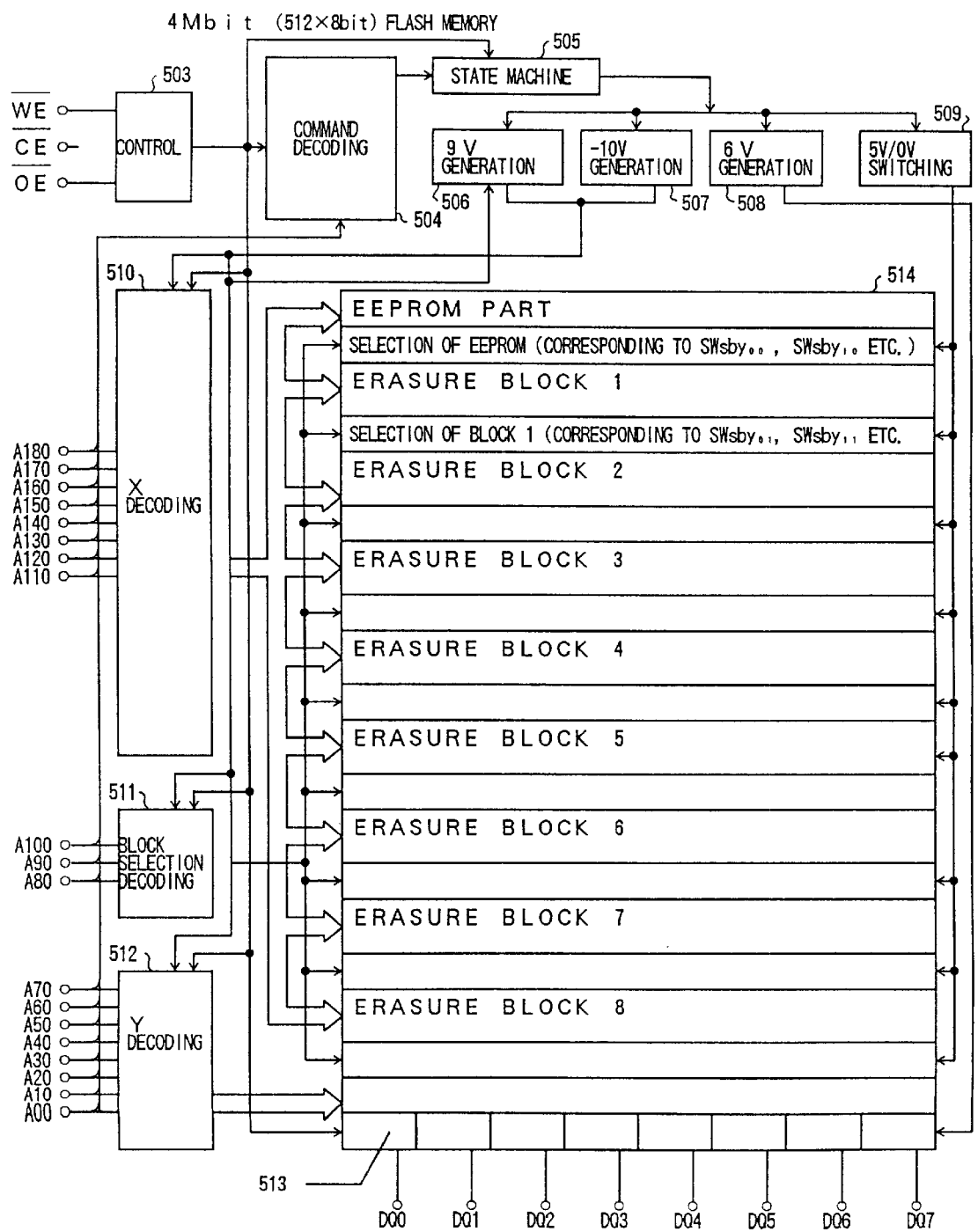
FIG. 12 shows an overall construction of a 4-mbit flash memory.

FIG. 12 shows an overall construction of a 4-mbit flash memory including the memory cell array shown in FIG. 11.

In FIG. 12, a command decoding circuit 504 decodes command sets supplied via the terminals A00 through A180 under the control of the control circuit 503. Based on a decoded command, a state machine 505 controls the status of a 9V generating circuit 506, a −10V generating circuit 507, a 6V generating circuit 508, a 5V/0V switching circuit 509. An X decoder circuit 510 decodes address signals supplied via the terminals A110 through A180 and, on the basis of signals from the control circuit 503, the 9V generating circuit 506 and the −10V generating circuit 507, supplies a predetermined voltage to the word lines. A block selection decoder 511 decodes address signals supplied via the terminals A80 through A100, and selects a sub-bit line and an erasure block on the basis of signals from the control circuit 503 and the 9V generating circuit 506. A Y decoder circuit 512 decodes address signals supplied via A00 through A70, and selects a global bit line on the basis of signals from the control circuit 503 and the 9V generating circuit 506. A sense amplifier/write circuit 513 detects data written in the memory cell and writes data therein. A memory unit 514 comprises a plurality of erasure blocks, each erasure block having the constitution shown in FIG. 11.

Figure 1A:
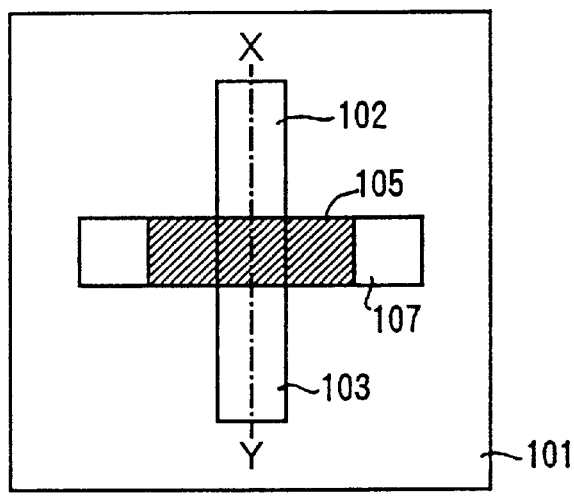
FIG. 1A is a top view of a stacked-gate transistor.
Figure 1B:
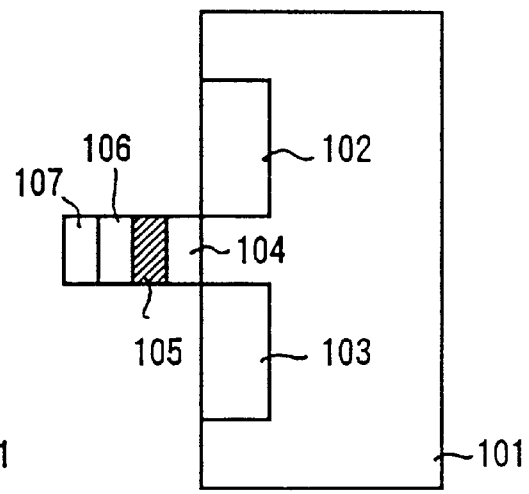
FIG. 1B is a lateral sectional view of the stacked-gate transistor.
Figure 2:
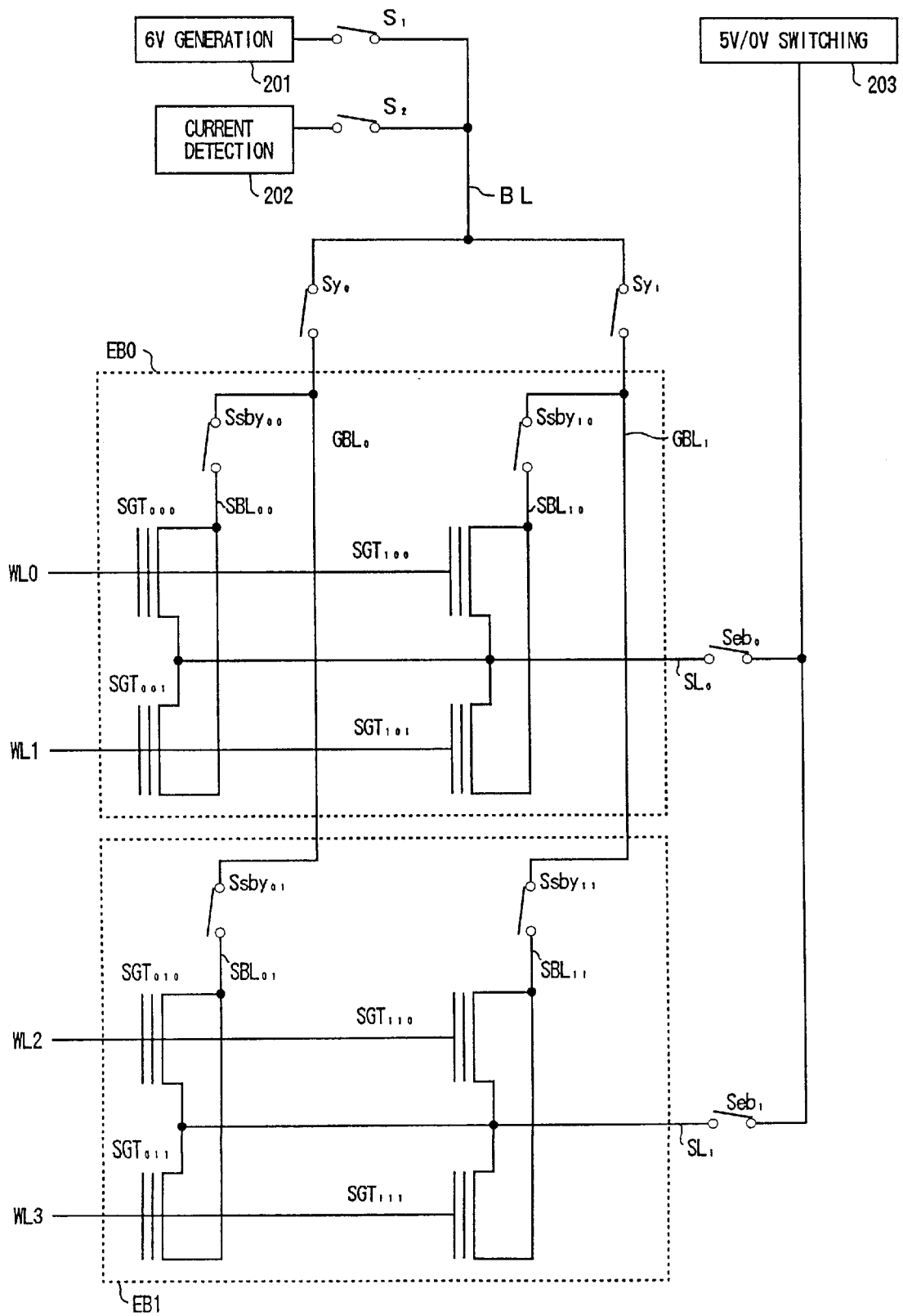
FIG. 2 shows transistors and peripheral circuits of a 8-bit flash memory.
Figure 3:
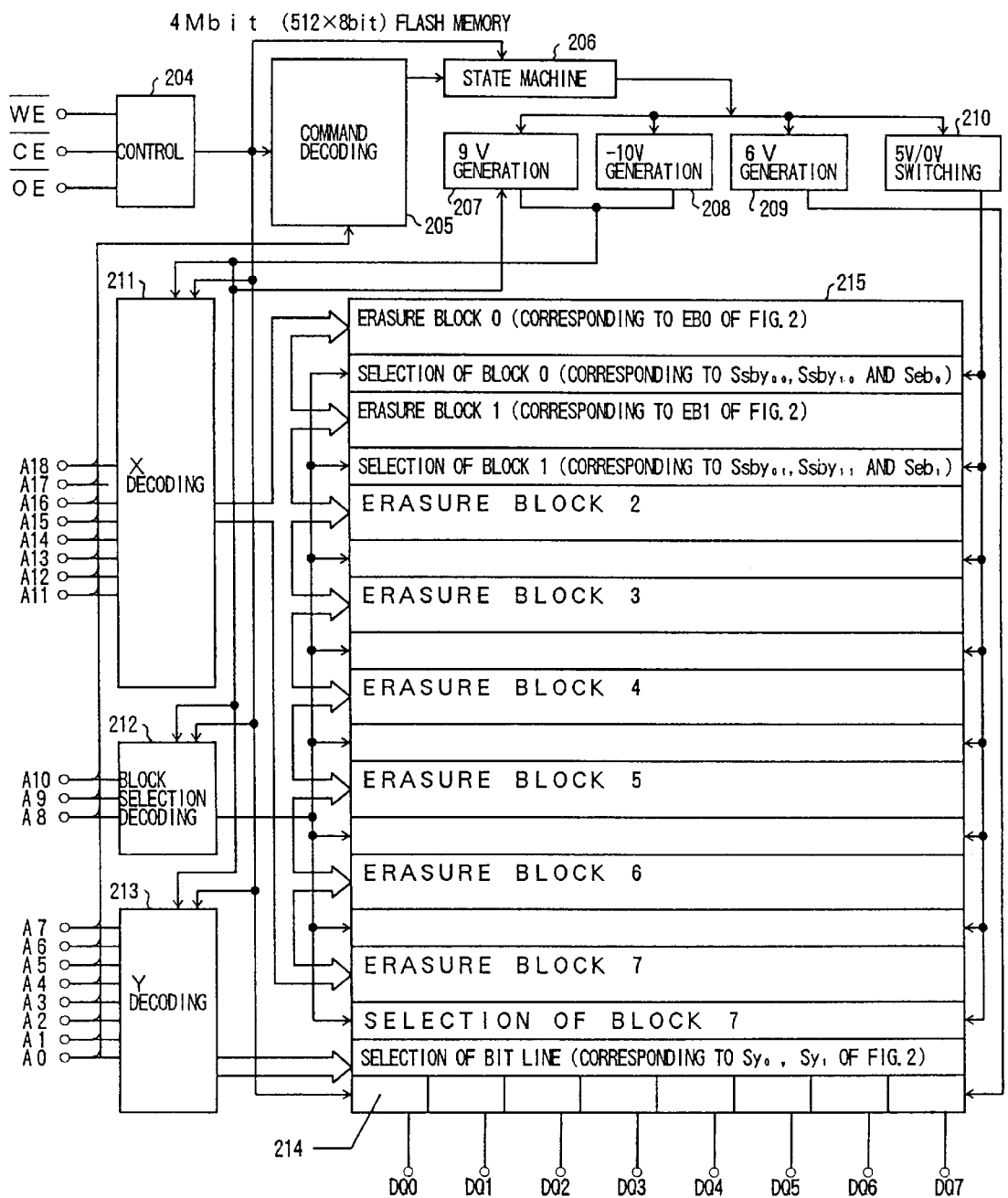
FIG. 3 shows an overall construction of a 4-mbit flash memory.
Figure 13:
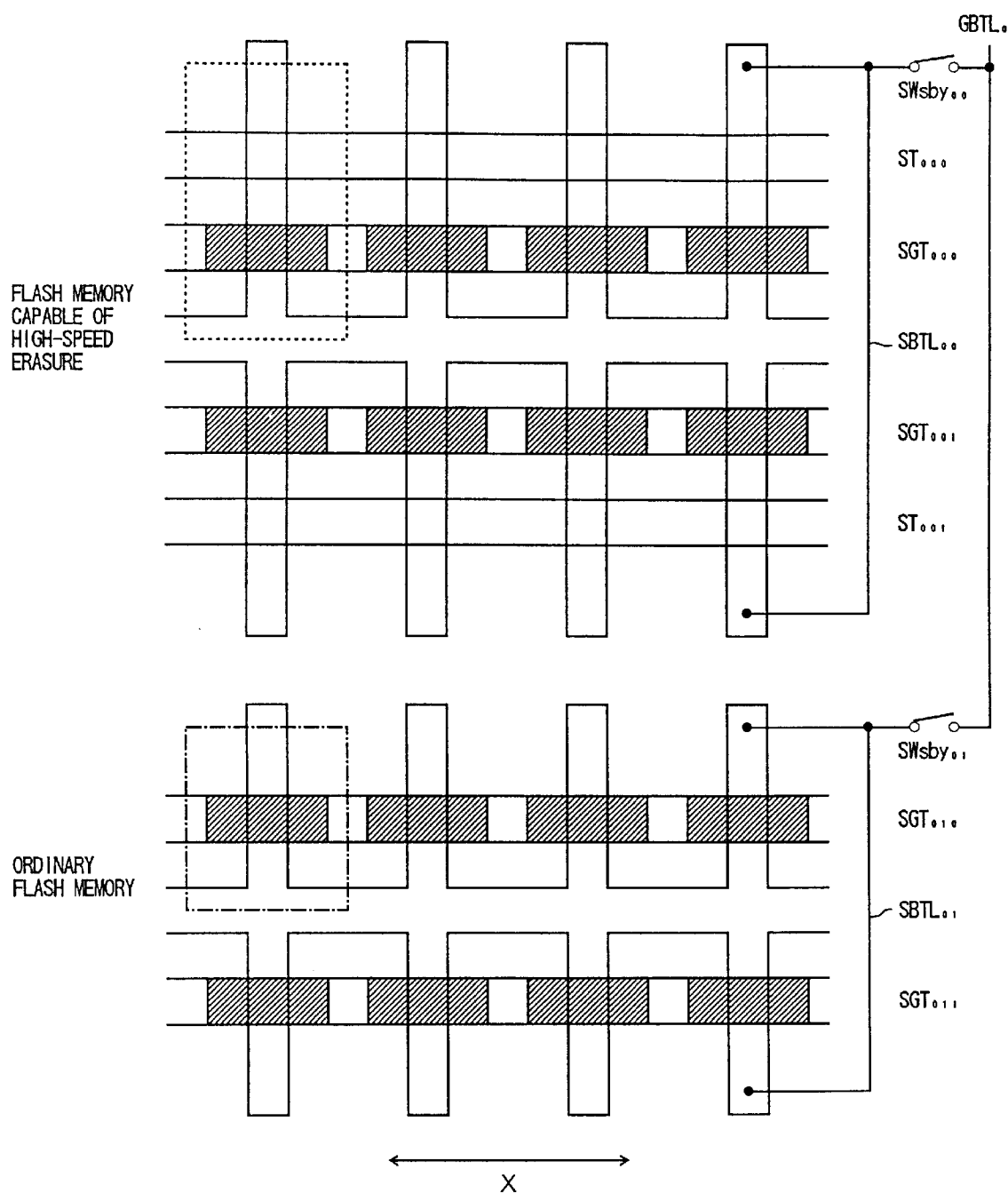
FIG. 13 shows a first method according to the present invention that allows a flash memory capable of high-speed erasure and an ordinary flash memory to coexist on a chip.

FIG. 13 shows a first method according to the present invention that allows a flash memory capable of high-speed erasure and an ordinary flash memory to coexist. The part indicated by a dotted line in FIG. 13 is the memory cell shown in FIG. 4 or the high-speed erasure flash memory cell according to the present invention shown in FIG. 10. The part indicated by the alternate long and short dash line is the ordinary flash memory cell shown in FIG. 1. As shown in FIG. 13, it is possible to share all the global bit lines easily if the X-direction size of the high-speed erasure flash memory cell consisting of the single-gate transistor and the stacked-gate transistor SGT is same as the X-direction size of the ordinary flash memory cell consisting of only the stacked-gate transistor.

Figure 5:
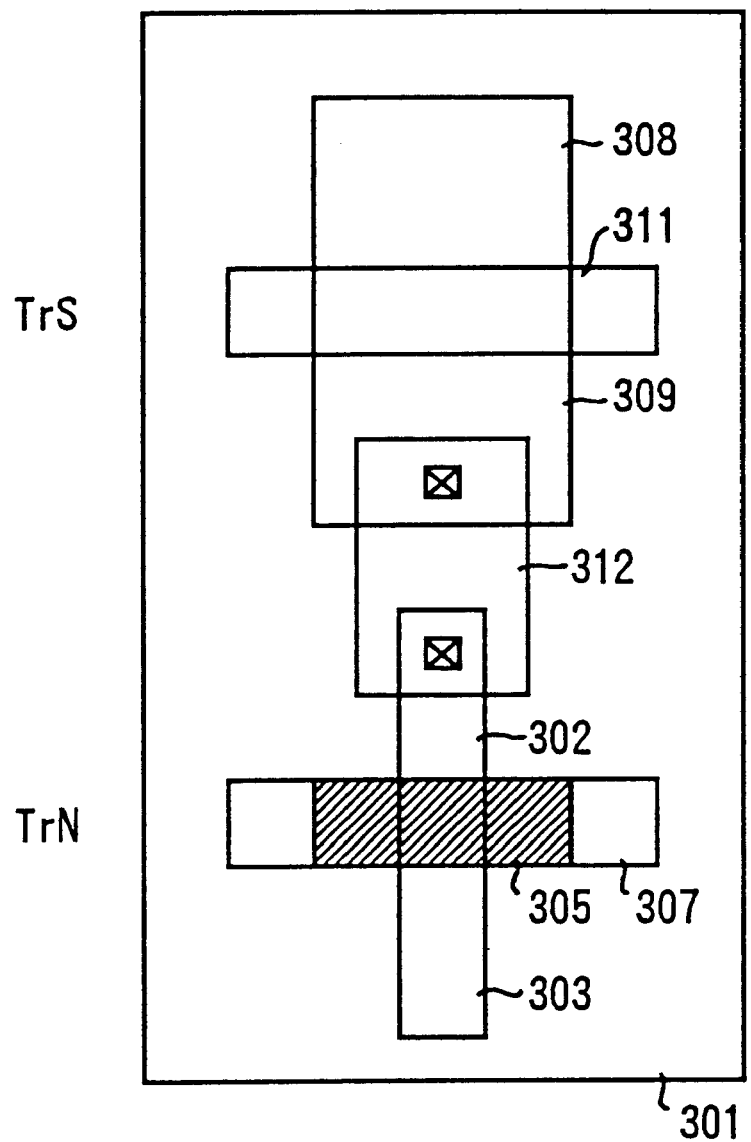
FIG. 5 shows a memory cell according to a second construction in which the problem of over erasure is resolved.
Figure 14:
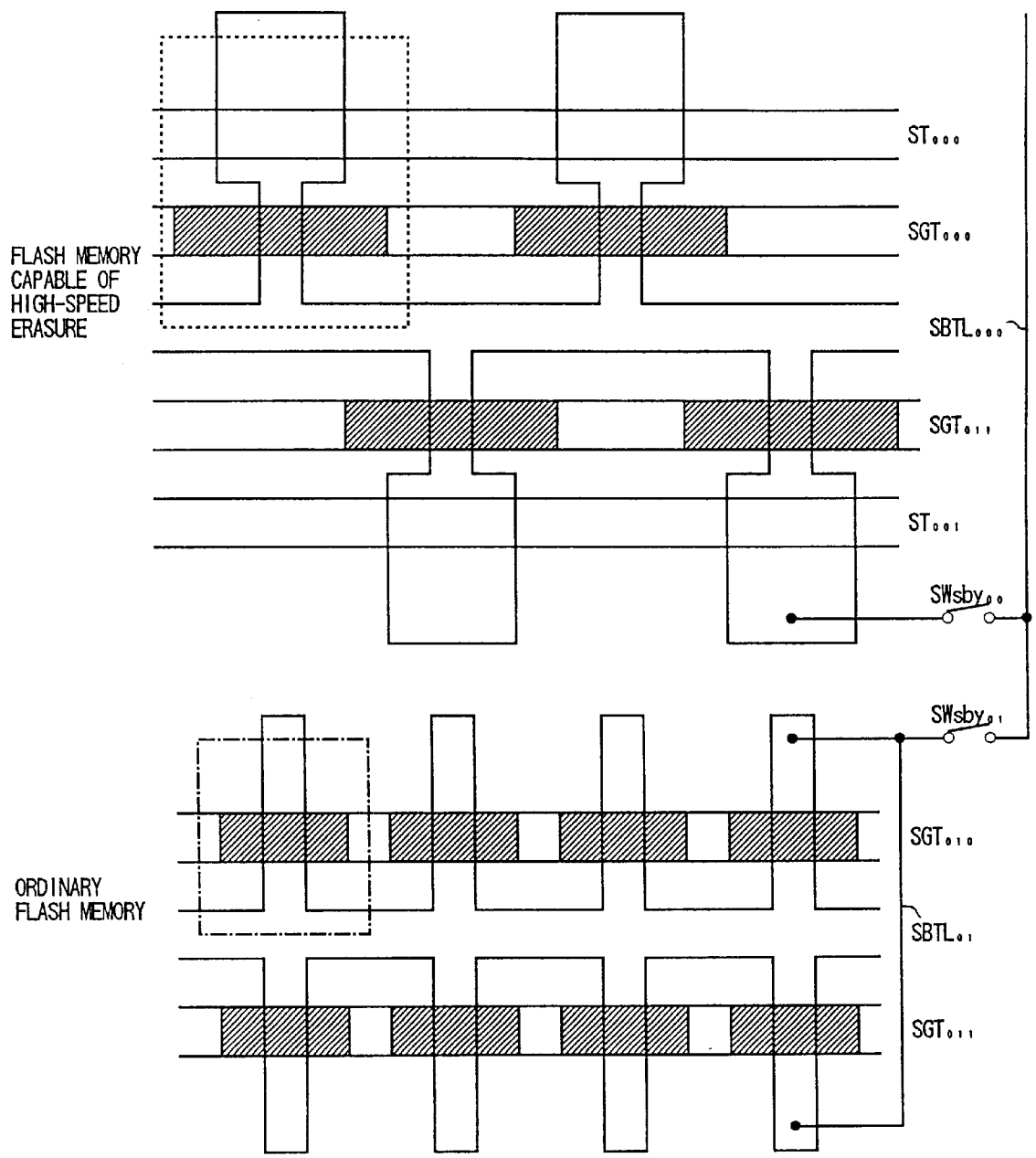
FIG. 14 shows a second method according to the present invention that allows a flash memory capable of high-speed erasure and an ordinary flash memory to coexist on a chip.

Even if the X-direction size of the high-speed erasure flash memory cell consisting of the single-gate transistor and the stacked-gate transistor SGT is larger than the X-direction size of the ordinary flash memory cell consisting of only the stacked-gate transistor SGT, all of the bit lines can be shared by using the arrangement of FIG. 14. The part indicated by the dotted line in FIG. 14 is the high-speed erasure flash memory cell having an extended gate width as shown in FIG. 5, and the part indicated by the alternate long and short dash line is the ordinary flash memory shown in FIG. 1.

Figure 15:
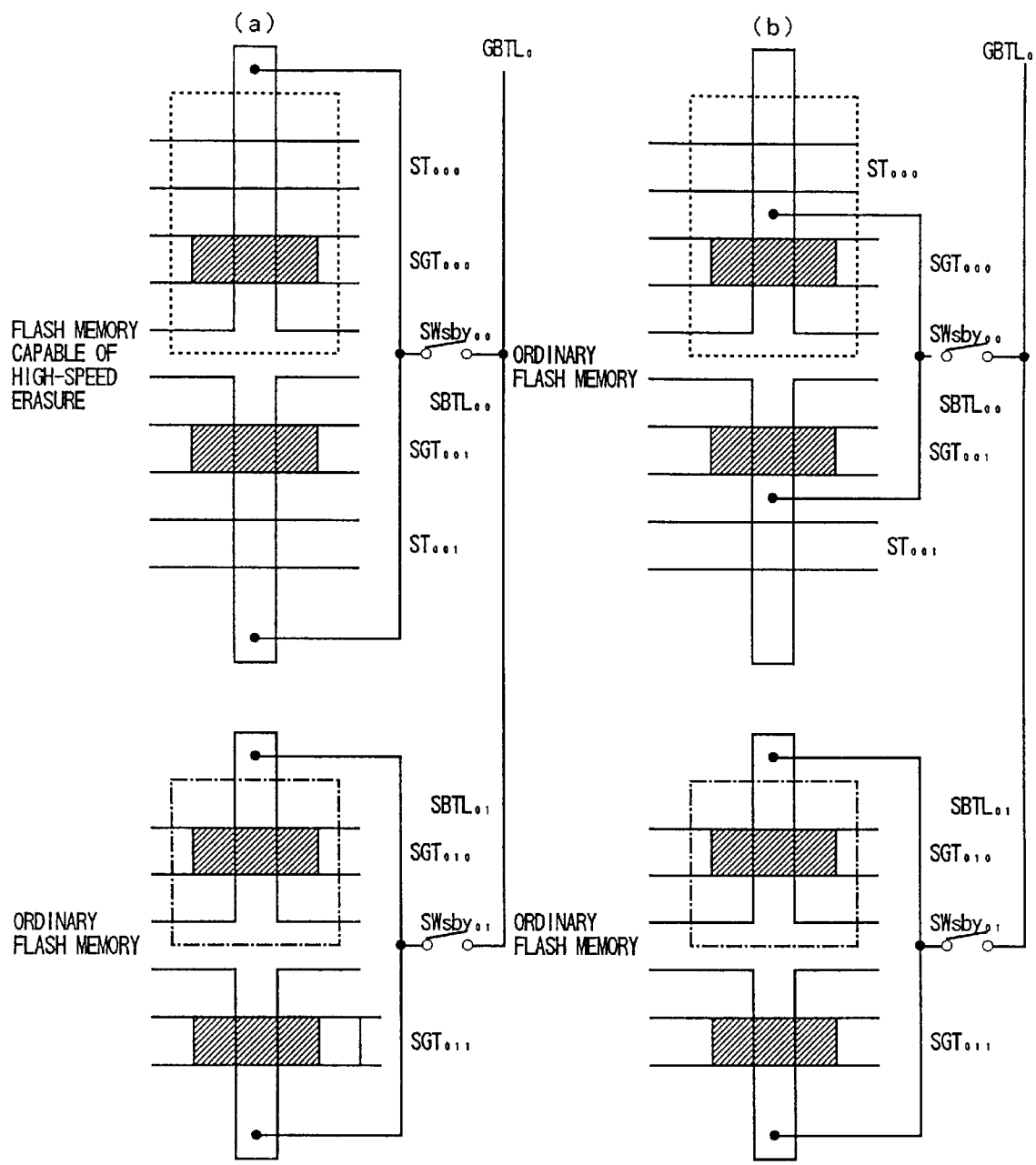
FIG. 15 shows a third method according to the present invention that allows a flash memory capable of high-speed erasure and an ordinary flash memory to coexist on a chip.

As shown in FIG. 15, it is also possible to change the storage capacity of the high-speed erasure flash memory and the storage capacity of the ordinary flash memory in a wiring process, by changing a method of connection between the high-speed erasure flash memory cell and the sub-bit line. The part indicated by the dotted line in FIG. 15 is the memory cell shown in FIG. 4 or the high-speed erasure flash memory according to the present invention shown in FIG. 10, and the part indicated by the alternate long and short dash line is the ordinary flash memory shown in FIG. 1.

FIGS. 15A and 15B show the arrangements of the memory cell which differ only in the connection of the bit line.

Referring to FIG. 15A, two memory cells constitute a high-speed erasure flash memory, and two memory cells constitute an ordinary flash memory. Referring to FIG. 15B, all of the four memory cells constitute an ordinary flash memory. In other words, the single-gate transistor does not function in the arrangement of FIG. 15B. Thus, two kinds of semiconductor memory devices can be produced using a common semiconductor memory manufacturing process, one comprising only ordinary flash memories one comprising an ordinary flash memory and a high-speed erasure flash memory. Alternatively, it is possible to change the capacity of the ordinary flash memory and the high-speed erasure flash memory.

Figure 16:
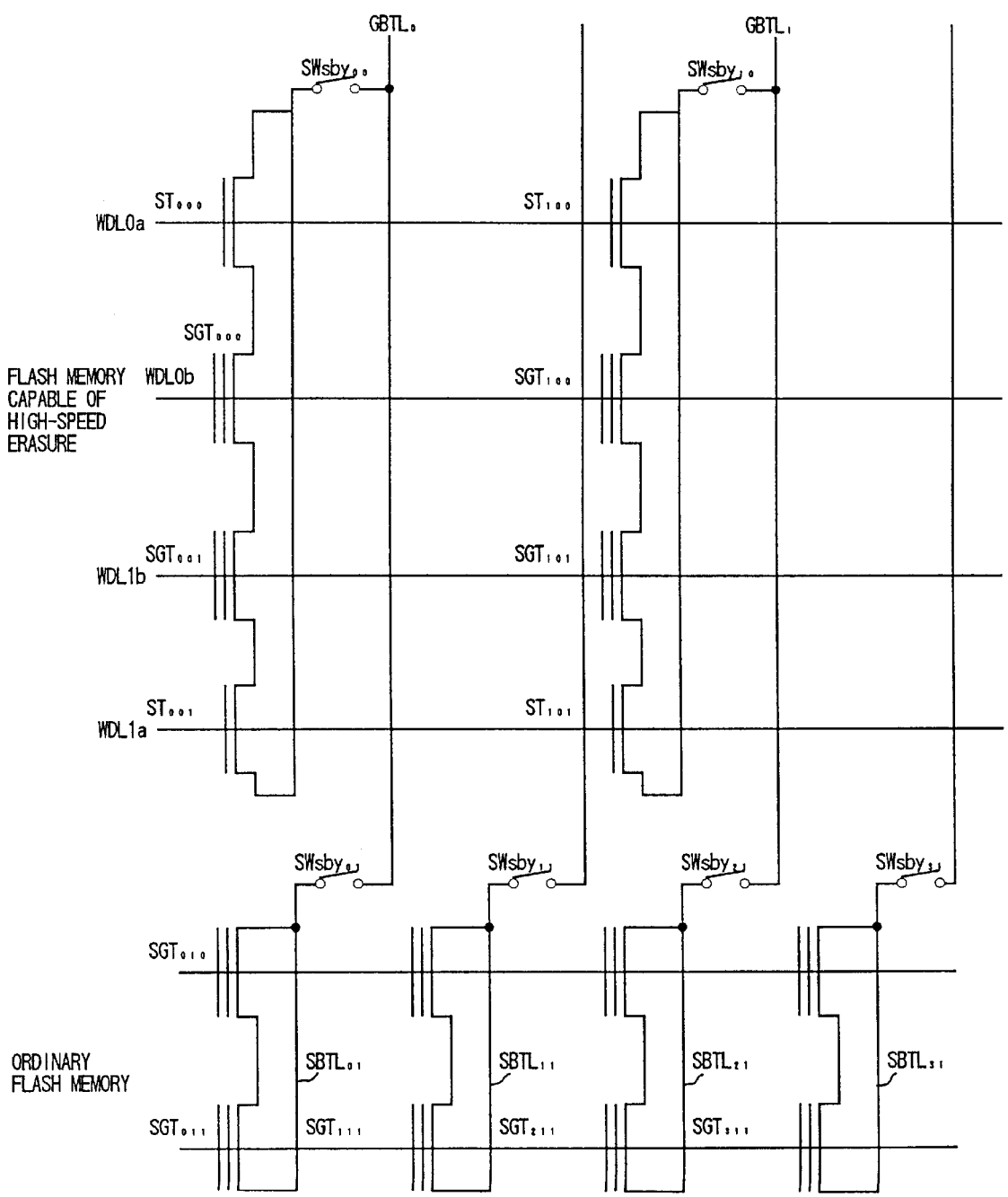
FIG. 16 shows a fourth method according to the present invention that allows a flash memory capable of high-speed erasure and an ordinary flash memory to coexist on a chip.

Such a variety contributes significantly to improvement of productivity. It is not a prerequisite to share all the bit lines. As shown in FIG. 16, it is conceivable to share some of the bit lines at periodical intervals.

In addition to sharing of bit lines as described above, constitutions as shown in FIG. 17 for sharing word lines are conceivable. The part indicated by the alternate long and short dash line in FIG. 17 is the ordinary flash memory cell, and the part indicated by the dotted line is the high-speed erasure flash memory cell.

In the case of the cell array as shown in FIG. 11, the transistor ST000 and the transistor SGT000 can be accessed at address #0, the transistor ST100 and the transistor SGT100 can be accessed at address #1, the transistor ST001 and the transistor SGT001 can be accessed at address #2, the transistor ST101 and the transistor SGT101 can be accessed at address #3, the transistor ST010 can be accessed at address #4, the transistor SGT110 can be accessed at address #5, the transistor SGT011 can be accessed at address #6, and the transistor SGT111 can be accessed at address #7. In other words, it is possible to arrange the high-speed erasure flash memory unit and the ordinary flash memory unit in a continuous address space. Compared to selection of memory cell arrays of different functions using control terminals according to the related art, such an arrangement provides more convenience.

Figure 17:
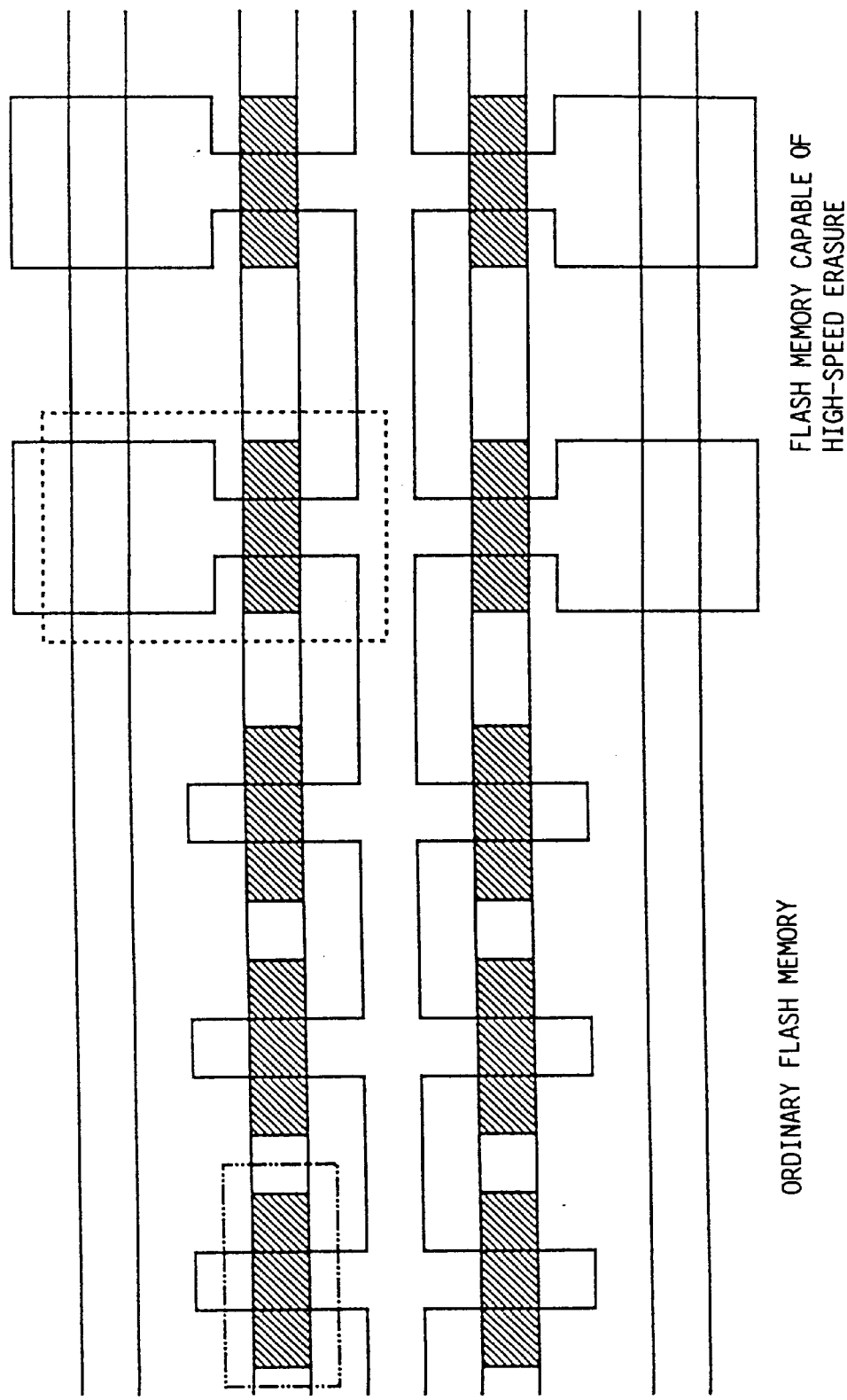
FIG. 17 shows a fifth method according to the present invention that allows a flash memory capable of high-speed erasure and an ordinary flash memory to coexist on a chip.
Figure 18:
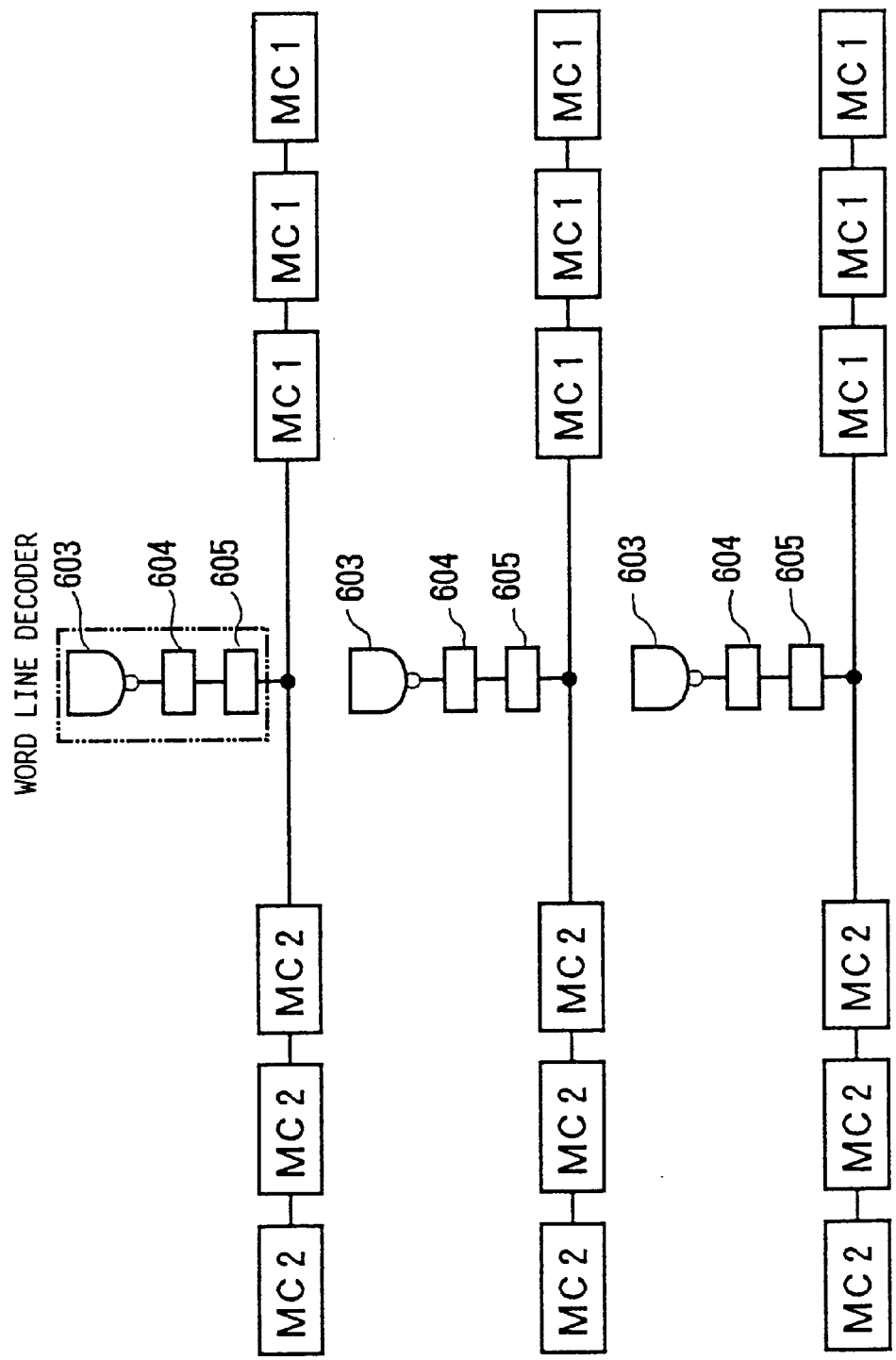
FIG. 18 shows a sixth method according to the present invention that allows a flash memory capable of high-speed erasure nd an ordinary flash memory to coexist on a chip.
Figure 19:
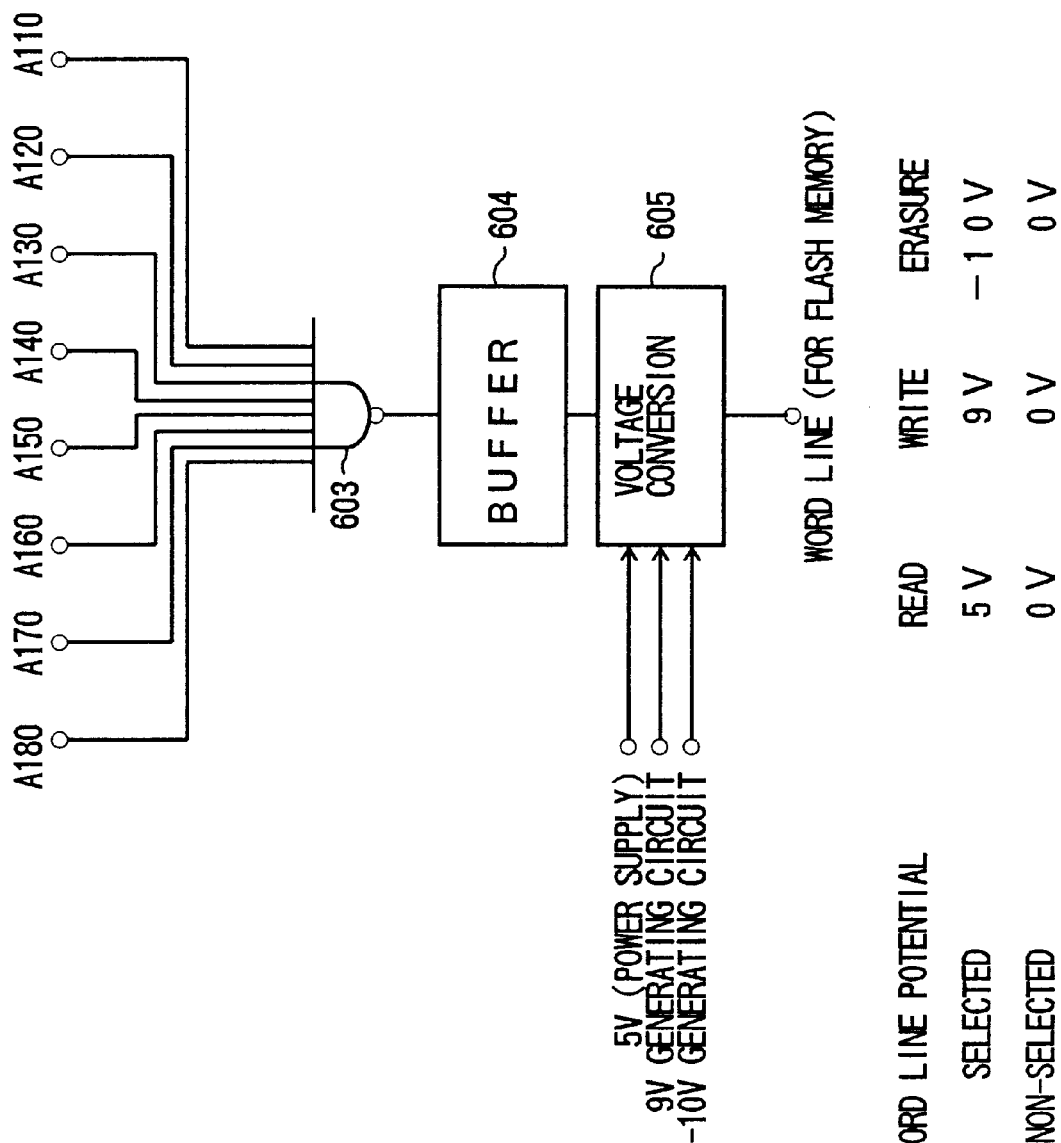
FIGS. 19A and 19B show how the method of FIG. 18 is implemented.

FIGS. 11 and 17 show how the chip size is reduced and the memory cell MC1 and the memory cell MC2 can share peripheral circuits for operating the memory cell array, by sharing bit lines and word lines. An alternative arrangement is shown in FIG. 18. Given that the word lines of the memory cell MC1 and the memory cell MC2 operate on the same voltage (when the gate of the single-gate transistor of the high-speed erasure memory cell is electrically connected to the control gate of the stacked-gate transistor), the word line decoder can be shared between the memory cell MC1 and the memory cell MC2, as shown in FIG. 18. The word line decoder in FIG. 18 is equivalent to the X-decoder shown in FIG. 12. The signal supplied from a decoding unit 603 is supplied to MC1 and MC2 via a buffer 604 and a voltage conversion circuit 605. FIGS. 19A and 19B show how the method of FIG. 18 is implemented. As shown in FIG. 19A, the word line decoder includes the voltage conversion circuit 605 for selecting the voltage supplied to the word line according to signals from the 5V power supply, the 9V generating circuit and the −10V generating circuit. In the example shown in FIGS. 18 and 19A, the memory cells MC1 and MC2 share the buffer 604 and the voltage conversion circuit 605 in addition to the decoding unit 603. FIG. 19B lists the voltages output to the word line when the memory cell is selected and not selected.

Figure 20:
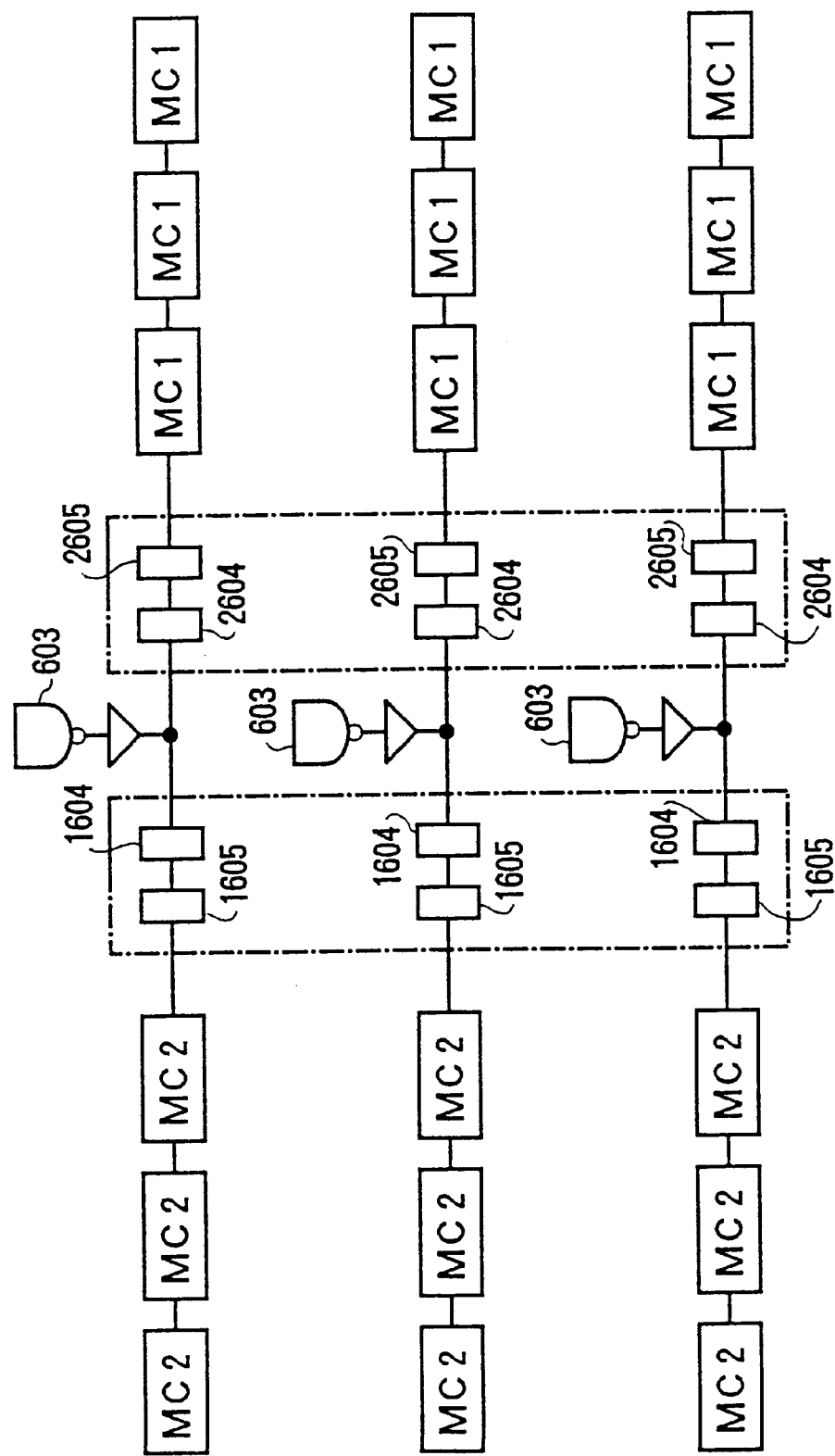
FIG. 20 shows a seventh method according to the present invention that allows a flash memory capable of high-speed erasure and an ordinary flash memory to exist oh a chip.

When different voltages are supplied to the word lines of the memory cells, it is conceivable that one of the circuits (decoding unit 603) is shared between the memory cells, as shown in FIG. 20. The signal output from the shared decoding unit 603 is supplied to MC2 via a buffer 1604 and a voltage conversion circuit 1605, and is supplied to MC1 via a buffer 2604 and a voltage conversion circuit 2605.

FIGS. 21A and 21B show how the method of FIG. 20 is implemented. As shown in FIG. 21A, the voltage conversion circuit 1605 selects the voltage supplied to the word line of the ordinary flash memory according to a signal output from the decoding unit 603, and signals from the 5V power supply, the 9V generating circuit, and the −10V circuit. Likewise, the voltage conversion circuit 2605 selects the voltage supplied to the word line of the high-speed erasure flash memory according to the signal output from the decoding unit 603, and the signals from the 5V power supply, the 9V generating circuit, and the −10V circuit. FIG. 21B lists the voltages output to the word line when the memory cell is selected and not selected.

The present invention is not limited to the above described embodiments, and variations and modifications may be made without departing from the scope of the present invention.

For example, the technology that allows sharing of bit lines and word lines between memory cells of different functions is not limited to the application to the flash memory and the high-speed erasure flash memory. The technology disclosed hereby may be applied to various kinds of memory cells such as a DRAM, an SRAM and a mask ROM.

What is claimed is:

1. A semiconductor memory device comprising a first semiconductor memory cell and a second semiconductor memory cell, wherein said first semiconductor memory cell comprises:

a single-gate transistor having a first gate; and a first stacked-gate transistor provided on the same chip as said single-gate transistor and having a second gate and a third gate, the second gate of said first stacked-gate transistor storing data by storing charge therein, and a source of said single-gate transistor being electrically connected to a drain of said first stacked-gate transistor, and said second semiconductor memory cell comprises a second stacked-gate transistor having a fourth gate and a fifth gate, and wherein the first gate and the third gate of said first semiconductor memory cell are controlled to have an identical electric potential.

2. A semiconductor memory device comprising a first semiconductor memory cell and a second semiconductor memory cell, wherein said first semiconductor memory cell comprises:

a single-gate transistor having a first gate; and a first stacked-gate transistor provided on the same chip as said single-gate transistor and having a second gate and a third gate, the second gate of said first stacked-gate transistor storing data by storing charge therein, and a source of said single-gate transistor being electrically connected to a drain of said first stacked-gate transistor, and said second semiconductor memory cell comprises a second stacked-gate transistor having a fourth gate and a fifth gate, and wherein the first gate prevents an erroneous current detection due to over erasure in said first stacked-gate transistor, based on a predetermined voltage, said single-gate transistor further comprises a first area of a first conductivity forming a source in a first semiconductor substrate of a second conductivity, and a second area of the first conductivity forming a drain in the first semiconductor substrate, said first stacked-gate transistor further comprises a third area of the first conductivity forming a source in the first semiconductor substrate and a fourth area of the first conductivity forming a drain in the first semiconductor substrate, the second area being electrically connected to the third area, said second stacked-gate transistor further comprises a fifth area of the second conductivity forming a source in the first semiconductor substrate and a sixth area of the second conductivity forming a drain in the first semiconductor substrate, and the second area of said single-gate transistor constituting said first semiconductor memory cell is formed to be integral with the third area of said first stacked-gate transistor.

3. A semiconductor memory device comprising a first memory cell array and a second memory cell array provided on the same substrate, wherein said first memory cell array being constructed such that a total of i semiconductor memory cells each having a first function are arranged in a first direction so as to constitute a word line of said first memory cell array and a total of j semiconductor memory cells each having the first function are arranged in a second direction so as to constitute a bit line of said first memory cell array, said second memory cell array being constructed such that a total of k semiconductor memory cells each having a second function are arranged in the first direction so as to constitute a word line of said second memory cell array and a total of l semiconductor memory cells each having the second function are arranged in the second direction so as to constitute a bit line of said second memory cell array, and said first memory cell array and said second memory cell array share at least one of the bit lines.

4. The semiconductor memory device as claimed in claim 3, wherein i is equal to k, so that said first memory cell array and said second memory cell array share all of the bit lines.

5. The semiconductor memory device as claimed in claim 3, wherein the semiconductor memory cells having the second function are arranged such that k=i/n and l=m*n, and said first memory cell array and said second memory cell array share all of the bit lines.

6. The semiconductor memory device as claimed in claim 3, wherein said semiconductor memory cell having the first function comprises:

a single-gate transistor having a first substrate of a first conductivity type, a first insulating film provided on the first substrate, a first gate provided on the first insulating film, a first area of a second conductivity type forming a source in the first substrate, and a second area of the second conductivity type forming a drain in the first substrate, a first stacked-gate transistor having the first substrate, a second insulating film provided on the first substrate, a second gate provided on the second insulating film, a third insulating film provided on the second gate, a third gate provided on the third insulating film, a third area of the second conductivity forming a source in the first substrate, and a fourth area of the second conductivity forming a drain in the first substrate, and wherein said semiconductor memory cell having the second function comprises:

a second stacked-gate transistor having the first substrate, a fourth insulating film provided on the second substrate, a fourth gate provided on the fourth insulating film, a fifth insulating film provided on the fourth gate, a fifth gate provided on the fifth insulating film, a fifth area of the second conductivity forming a source in the first substrate, and a sixth area of the second conductivity forming a drain in the first substrate.

7. The semiconductor memory device as claimed in claim 6, wherein the second area is electrically connected to the third area, and the first area and the fifth area are connected to the respective bit lines.

8. The semiconductor memory device as claimed in claim 6, wherein the third area and the fifth area are connected to the respective bit lines.

9. The semiconductor memory device as claimed in claim 6, wherein a selection is available in a process of fabricating said semiconductor memory device between a first configuration in which the second area and the third area of the semiconductor memory cell having the first function are electrically connected to each other, and a second configuration in which the third area is connected to the associated bit line.

10. The semiconductor memory device as claimed in claim 3, wherein said first memory cell array and said second memory cell array share at least one of the bit lines.

11. A semiconductor memory device comprising first semiconductor memory cells each having a first function and second semiconductor memory cells each having a second function, wherein
the first semiconductor memory cells and the second semiconductor memory cells have continuous addresses, and
the first and second functions have electrically different characteristics.

12. A semiconductor memory device comprising first semiconductor memory cells each having a first function and second semiconductor memory cells each having a second function, wherein
a first word line decoder for driving the first semiconductor memory cells and a second word line decoder for driving the second semiconductor memory cells are identical, and
the first and second functions have electrically different characteristics.

13. A semiconductor memory device comprising first semiconductor memory cells each having a first function and second semiconductor memory cells each having a second function, wherein
a first word line decoder for driving the first semiconductor memory cells and a second word line decoder for driving the second semiconductor memory cells share a decoding unit, and
the first and second functions have electrically different characteristics.

14. The semiconductor memory device as claimed in claim 1, wherein the first and second semiconductor memory cells share a word line.

15. The semiconductor memory device as claimed in claim 2, wherein the first and second semiconductor memory cells share a word line.

16. The semiconductor memory device as claimed in claim 3, wherein the first and second semiconductor memory cells share a word line.

* * * * *